US012813157B2

(12) United States Patent
Kim et al.

(10) Patent No.: US 12,813,157 B2
(45) Date of Patent: Nov. 24, 2026

(54) COMPOUND, NEAR-INFRARED ABSORBING AND/OR BLOCKING FILM, PHOTOELECTRIC DEVICE, ORGANIC SENSOR, AND ELECTRONIC DEVICE INCLUDING SAME

(71) Applicant: Samsung Electronics Co., Ltd., Suwon-si (KR)

(72) Inventors: Sangdong Kim, Suwon-si (KR); Sang Ho Park, Suwon-si (KR); Rae Sung Kim, Suwon-si (KR); Insun Park, Suwon-si (KR); Dong-Seok Leem, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 740 days.

(21) Appl. No.: 18/449,152

(22) Filed: Aug. 14, 2023

(65) Prior Publication Data

US 2024/0074313 A1 Feb. 29, 2024

(30) Foreign Application Priority Data

Aug. 12, 2022 (KR) ........................ 10-2022-0101629

(51) Int. Cl.
*H10K 85/60* (2023.01)
*H10K 39/00* (2026.01)
*H10K 39/32* (2026.01)

(52) U.S. Cl.
CPC ........... *H10K 85/658* (2023.02); *H10K 39/32* (2023.02); *H10K 39/501* (2023.02); (Continued)

(58) Field of Classification Search
CPC ...... H10K 85/658; H10K 85/322; C07F 5/022
See application file for complete search history.

(56) References Cited

U.S. PATENT DOCUMENTS 9,685,616 B2 6/2017 Weiss et al.
2006/0003183 A1 1/2006 Helber et al.
(Continued)

FOREIGN PATENT DOCUMENTS

EP 03890041 A1 10/2021
KR 2015-0020297 A 2/2015
(Continued)

OTHER PUBLICATIONS

Extended European Search Report dated Jan. 4, 2024 for corresponding European Application No. 23191256.9.
(Continued)

*Primary Examiner* — Sean M DeGuire
(74) *Attorney, Agent, or Firm* — Harness, Dickey & Pierce, P.L.C.

(57) ABSTRACT

A compound represented by Chemical Formula 1, and near-infrared absorbing/blocking films, photoelectric devices, organic sensors, and electronic devices including the compound are provided:

[Chemical Formula 1]

(Continued)

wherein, in Chemical Formula 1, $X^1$ to $X^4$, and $R^1$ to $R^9$ are the same as defined in the detailed description.

20 Claims, 16 Drawing Sheets

(52) U.S. Cl.
CPC ....... *H10K 85/653* (2023.02); *H10K 85/6574* (2023.02); *H10K 39/621* (2023.02)

(56) References Cited

U.S. PATENT DOCUMENTS

| | | | |
|---|---|---|---|
| 2016/0141497 A1 | 5/2016 | Weiss et al. |
| 2020/0071343 A1 | 3/2020 | Mirloup et al. |
| 2021/0403488 A1 | 12/2021 | Lee et al. |
| 2023/0033629 A1 | 2/2023 | Lunt, III et al. |

FOREIGN PATENT DOCUMENTS

| | | |
|---|---|---|
| KR | 101878426 B1 | 7/2018 |
| WO | WO-2014/025435 A9 | 4/2014 |
| WO | 2018/223876 A1 | 12/2018 |
| WO | WO-2020/175841 A1 | 9/2020 |
| WO | WO-2021/150504 A1 | 7/2021 |
| WO | WO-21188392 A1 | 9/2021 |
| WO | 2022/197554 A1 | 9/2022 |

OTHER PUBLICATIONS

Sobenina, Lubov N., et al. "General route to symmetric and asymmetric meso-CF3-3 (5)-aryl (hetaryl)-and 3, 5-diaryl (dihetaryl)-BODIPY dyes." *Organic Letters* 13.10 (2011): 2524-2527.

Jorge Labella, et al., "Annulative π-extension of BODIPYs made easy via gold(i)-catalyzed cycloisomerization", Chemical Science, Royal Society of Chemistry, vol. 11, No. 10778, DOI: 10.1039/d0sc01054e.

Yosuke Hayashi, et al., "Facile Synthesis of Biphenyl-Fused BODIPY and Its Property", Organic Letters, vol. 14, No. 3, pp. 866-869, 2012.

Pradeep Shrestha, et al., "Efficient Far-Red/Near-IR Absorbing BODIPY Photocages by Blocking Unproductive Conical Intersections", Journal of the American Chemical Society, DOI: 10.1021/jacs.0c07139, Aug. 12, 2020.

Zhikuan Zhou, et al., "Naphtho[b]-fused BODIPYs: one pot Suzuki-Miyaura-Knoevenagel synthesis and photophysical properties", Royal Society of Chemistry, Communication, 2017.

Luca Mologni, et al., "Discovery of Novel a-Carboline Inhibitors of the Anaplastic Lymphoma Kinase", ACS Omega, 7, pp. 17083-17097, 2022.

Exact Mass : 414.13

Exact Mass : 412.12

4-b

MW : 443.27

MW : 489.05
Chemical Formula A-4

COMPOUND, NEAR-INFRARED ABSORBING AND/OR BLOCKING FILM, PHOTOELECTRIC DEVICE, ORGANIC SENSOR, AND ELECTRONIC DEVICE INCLUDING SAME

CROSS-REFERENCE TO RELATED APPLICATIONS

This application claims priority to and the benefit of, under 35 U.S.C. § 119, Korean Patent Application No. 10-2022-0101629 filed in the Korean Intellectual Property Office on Aug. 12, 2022, the entire contents of which are incorporated herein by reference.

BACKGROUND

1. Field

Example embodiments relate to novel compounds and photoelectric devices, image sensors, and/or electronic devices including the same.

2. Description of Related Art

A photoelectric device converts light into an electrical signal using photoelectric effects, it may include a photodiode, a phototransistor, and the like, and it may be applied to (e.g., included in) an image sensor, a solar cell, an organic light emitting diode, and the like.

An image sensor including a photodiode may have high resolution and thus a small pixel. At present, a silicon photodiode is widely used, but it has a problem of deteriorated sensitivity since it has a small absorption area due to small pixels. Accordingly, an organic material that is capable of replacing silicon has been researched.

SUMMARY

Some example embodiments provide a novel compound (also referred to herein interchangeably as a compound). The novel compound may be an organic material that has a high extinction coefficient and selectively absorbs light in a particular wavelength region depending on a molecular structure, and thus may simultaneously replace a photodiode and a color filter and resultantly improve sensitivity and contribute to high integration of an image sensor that includes the novel compound therein.

Some example embodiments provide a near-infrared absorbing/blocking film including the novel compound.

Some example embodiments provide a photoelectric device including the novel compound.

Some example embodiments provide an image sensor including the photoelectric device.

Some example embodiments provide an organic sensor including the image sensor.

Some example embodiments provide an electronic device including the organic sensor.

According to some example embodiments, a novel compound may be represented by Chemical Formula 1.

[Chemical Formula 1]

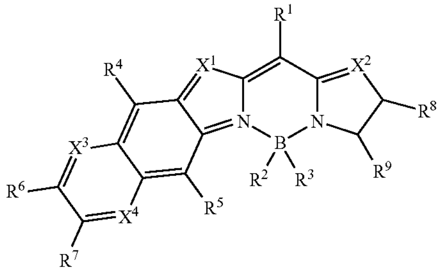

In Chemical Formula 1, $R^1$ may be a substituted or unsubstituted C1 to C30 alkyl group, a substituted or unsubstituted C1 to C30 alkoxy group, a halogen, a cyano group, a nitro group, or any combination thereof, $R^2$ and $R^3$ may independently be a halogen, $R^4$ to $R^9$ may independently be hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C3 to C30 cycloalkenyl group, a substituted or unsubstituted C2 to C30 heteroalkenyl group, a substituted or unsubstituted C2 to C30 heterocycloalkenyl group, a substituted or unsubstituted C2 to C30 alkynyl group, a substituted or unsubstituted C3 to C30 cycloalkynyl group, a substituted or unsubstituted C2 to C30 heteroalkynyl group, a substituted or unsubstituted C2 to C30 heterocycloalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof, $X^1$ to $X^4$ may independently be N or $CR^a$, wherein $R^a$ is hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 heteroalkenyl group, a substituted or unsubstituted C2 to C30 alkynyl group, a substituted or unsubstituted C2 to C30 heteroalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof.

In Chemical Formula 1, $R^1$ may be a substituted or unsubstituted C1 to C10 alkyl group, a substituted or unsubstituted C1 to C10 alkoxy group, a halogen, a cyano group, a nitro group, or any combination thereof, and $R^2$ and $R^3$ may be independently fluorine, chlorine, bromine, or iodine.

In Chemical Formula 1, at least one pair of a pair of $R^6$ and $R^7$ or a pair of $R^8$ and $R^9$ may be linked to each other to form at least one substituted or unsubstituted fused ring, and the at least one substituted or unsubstituted fused ring may include a substituted or unsubstituted C3 to C30 cycloaliphatic group, a substituted or unsubstituted C3 to C30 hetero cycloaliphatic group, a substituted or unsubstituted C6 to C30 aryl group, a substituted or unsubstituted C3 to C30 heteroaryl group, or any combination thereof.

In Chemical Formula 1, $X^1$ and $X^2$ may independently be $CR^a$, wherein $R^a$ may be hydrogen, deuterium, a halogen, a substituted or unsubstituted C1 to C10 alkyl group, a substituted or unsubstituted C1 to C5 alkoxy group, or any combination thereof, $X^3$ and $X^4$ may independently be N, and $R^4$ to $R^9$ may independently be hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof.

In Chemical Formula 1, $R^1$ may be a halogen-substituted C1 to C4 alkyl group, or a cyano group, $R^4$ to $R^9$ may independently be hydrogen, deuterium, a halogen, a substituted or unsubstituted C1 to C10 alkyl group, a substituted or unsubstituted C3 to C6 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C10 aryl group, a substituted or unsubstituted C1 to C5 alkoxy group, or any combination thereof, and $X^1$ to $X^4$ may independently be N or —CH.

In Chemical Formula 1, $X^1$ and $X^2$ may independently be $CR^a$, wherein R a may be hydrogen, deuterium, a halogen, a substituted or unsubstituted C1 to C10 alkyl group, a substituted or unsubstituted C1 to C5 alkoxy group, or any combination thereof, $X^3$ and $X^4$ may independently be N, and $R^4$ to $R^9$ may independently be hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof.

In Chemical Formula 1, $R^1$ may be a halogen-substituted C1 to C4 alkyl group, or a cyano group, $R^4$ to $R^9$ may independently be hydrogen, deuterium, a halogen, a substituted or unsubstituted C1 to C10 alkyl group, a substituted or unsubstituted C3 to C6 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C10 aryl group, a substituted or unsubstituted C1 to C5 alkoxy group, or any combination thereof, and $X^1$ to $X^4$ may independently be N or —CH.

The compound represented by Chemical Formula 1 may include a compound represented by Chemical Formula 2:

[Chemical Formula 2]

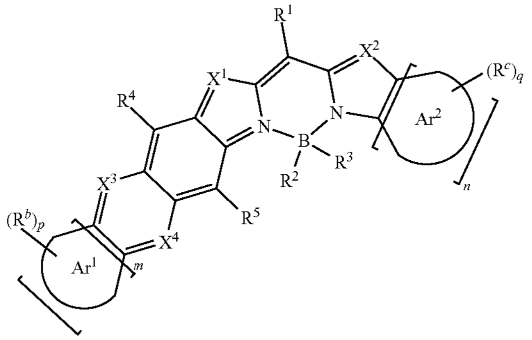

In Chemical Formula 2, $R^1$ to $R^5$, and $X^1$ to $X^4$ may independently be the same as $R^1$ to $R^5$, and $X^1$ to $X^4$ of Chemical Formula 1, $R^b$ and $R^c$ may independently be hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 heteroalkenyl group, a substituted or unsubstituted C2 to C30 heterocycloalkenyl group, a substituted or unsubstituted C2 to C30 alkynyl group, a substituted or unsubstituted C2 to C30 heteroalkynyl group, a substituted or unsubstituted C6 to C30 aryl group, a substituted or unsubstituted C2 to C30 heteroaryl group, a substituted or unsubstituted C1 to C30 alkoxy group, a substituted or unsubstituted C6 to C30 aryloxy group, or any combination thereof, $Ar^1$ and $Ar^2$ may independently be a substituted or unsubstituted C3 to C30 cycloaliphatic group, a substituted or unsubstituted C3 to C30 hetero cycloaliphatic group, a substituted or unsubstituted C6 to C30 aryl group, a substituted or unsubstituted C3 to C30 heteroaryl group, or any combination thereof, m and n may independently be an integer ranging from 0 to 7, provided 0 m+n≤7, wherein if m and n are independently an integer greater than or equal to 2, then two or more $Ar^1$ of Chemical Formula 2 are the same as or different from each other, and two or more $Ar^2$ of Chemical Formula 2 are the same as or different from each other, and p and q may independently be an integer greater than or equal to 0, provided that they are not greater than the valence of $Ar^1$ and $Ar^2$, respectively.

In Chemical Formula 2, m and n may independently be an integer ranging from 0 to 3.

In Chemical Formula 2, m may be an integer from 0 to 2, and n may be an integer from 1 to 3.

The compound represented by Chemical Formula 1 may include a compound represented by Chemical Formula 3:

[Chemical Formula 3]

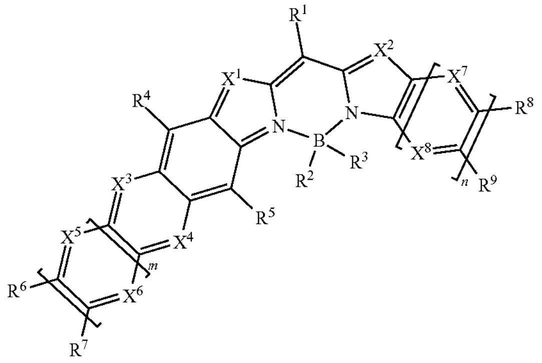

In Chemical Formula 3, $R^1$ to $R^9$, and $X^1$ to $X^4$ may independently be the same as $R^1$ to $R^9$, and $X^1$ to $X^4$ of Chemical Formula 1, $X^5$ to $X^5$ may independently be N or $CR^a$, wherein R a may be hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 heteroalkenyl group, a substituted or unsubstituted C2 to C30 alkynyl group, a substituted or unsubstituted C2 to C30 heteroalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof, m and n may independently be an integer ranging from 0 to 7, provided $0 \leq m+n \leq 7$, wherein if m and n are independently an integer greater than or equal to 2, then each $X^5$ to $X^5$ included in each repeating structure of Chemical Formula 3 is the same as or different from each $X^5$ to $X^5$ included in other repeating structures of Chemical Formula 3.

In Chemical Formula 3, m and n may independently be an integer ranging from 0 to 3.

The compound represented by Chemical Formula 1 may include any one of:

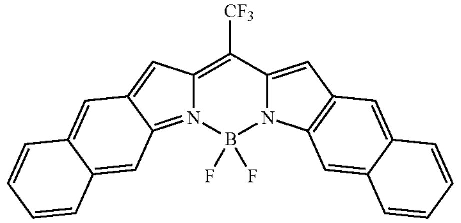

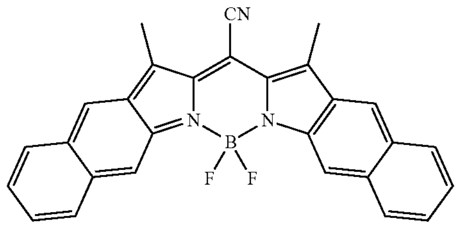

-continued

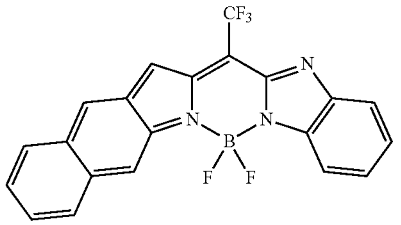

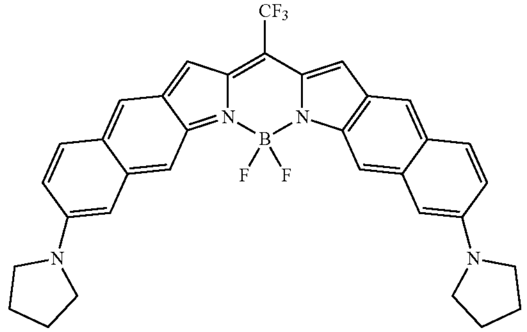

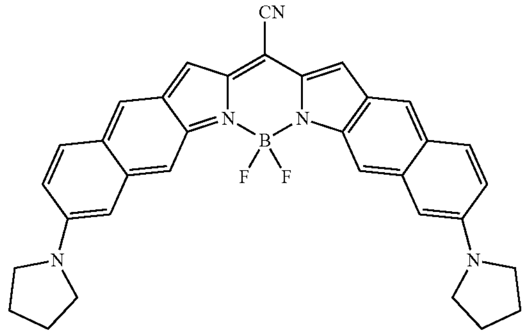

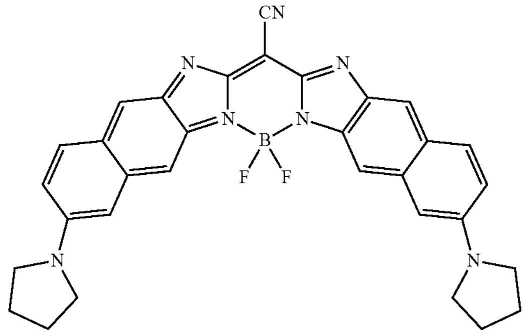

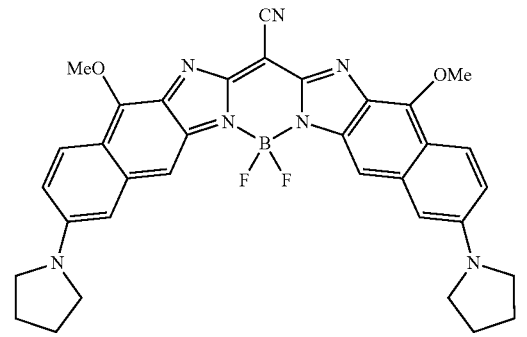

-continued

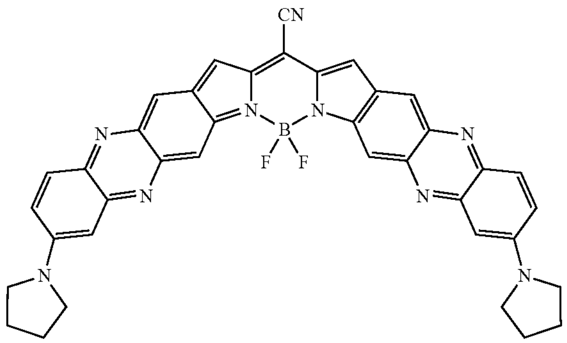

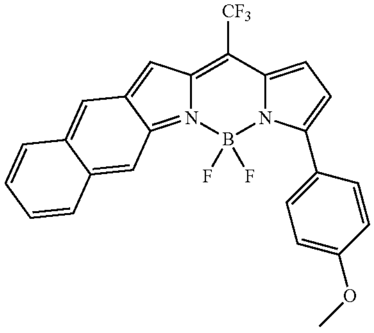

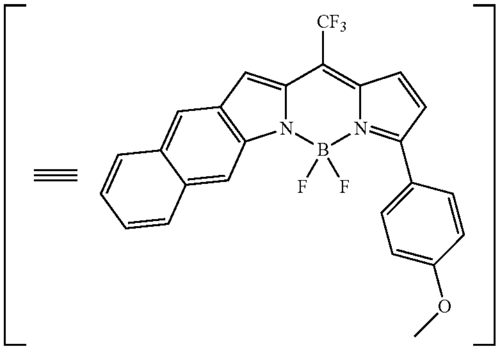

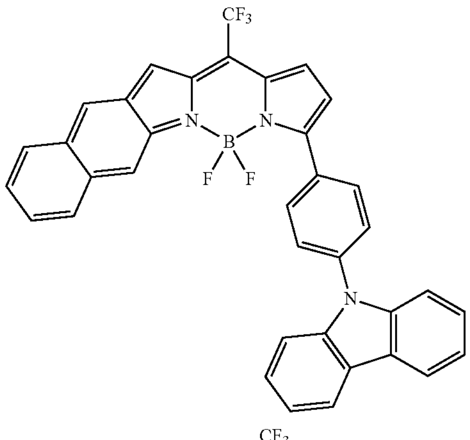

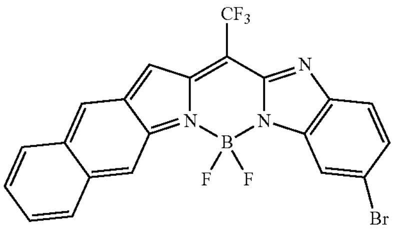

-continued

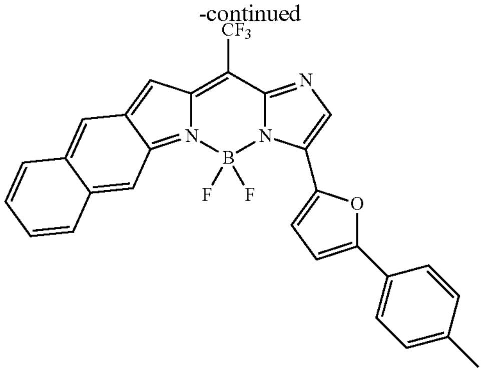

.

The compound represented by Chemical Formula 1 may have a molecular weight of about 250 grams per mole (g/mol) to about 750 g/mol.

A peak absorption wavelength of the compound represented by Chemical Formula 1 may be in a wavelength region of about 750 nm to about 3000 nm.

According to some example embodiments, a near-infrared absorbing/blocking film (absorbing and/or blocking film) may include the compound represented by Chemical Formula 1.

According to some example embodiments, a photoelectric device may include a first electrode and a second electrode facing each other, and an active layer between the first electrode and the second electrode, wherein the active layer may include the compound represented by Chemical Formula 1.

A peak absorption wavelength of the active layer may be in a wavelength region of about 750 nm to about 3000 nm.

According to some example embodiments, a photoelectric device may include a first electrode and a second electrode facing each other, an active layer between the first electrode and the second electrode, and a charge auxiliary layer between the active layer and the first electrode, or between the active layer and the second electrode, and the charge auxiliary layer may include the compound represented by Chemical Formula 1.

According to some example embodiments, an organic sensor may include the photoelectric device.

According to some example embodiments, an electronic device may include the photoelectric device.

According to some example embodiments, an electronic device may include the organic sensor.

The novel compound may exhibit good absorbing properties in the near-infrared region, for example, in a long wavelength region, and thus, may be effectively used as a near-infrared absorber in near-infrared absorbing and/or blocking films, photoelectric devices, image sensors, and/or electronic devices.

DETAILED DESCRIPTION

Figure 1:
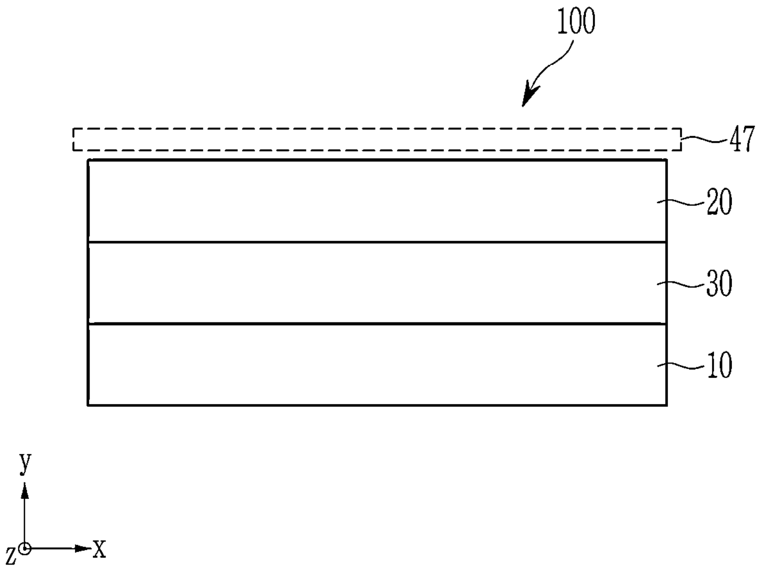
FIG. 1 is a cross-sectional view showing a photoelectric device according to some example embodiments.

Hereinafter, some example embodiments will hereinafter be described in detail, and may be easily performed by a person having an ordinary skill in the related art. However, the inventive concepts may be embodied in many different forms and are not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

As used herein, when a definition is not otherwise provided, "substituted" refers to replacement of hydrogen of a compound by a halogen atom (F, Br, Cl, or I), a hydroxy group, a nitro group, a cyano group, an amino group, an azido group, an amidino group, a hydrazino group, a hydrazono group, a carbonyl group, a carbamoyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and any combination thereof.

As used herein, when specific definition is not otherwise provided, "hetero" refers to one including 1 to 3 heteroatoms selected from N, O, S, P, and Si.

As used herein, "an alkyl group" for example refers to a methyl group, an ethyl group, a propyl group, an isopropyl group, an n-butyl group, an isobutyl group, a t-butyl group, a pentyl group, a hexyl group, and the like.

As used herein, "a cycloalkyl group" refers to a cyclopropyl group, a cyclobutyl group, a cyclopentyl group, a cyclohexyl group, and the like.

As used herein, "aryl group" refers to a substituent including all element of the cycle having p-orbitals which form conjugation, and may be a monocyclic, polycyclic or fused polycyclic (e.g., rings sharing adjacent pairs of carbon atoms) functional group.

As used herein, when a definition is not otherwise provided, "a cyano-containing group" refers to a monovalent group such as a C1 to C30 alkyl group, a C2 to C30 alkenyl group, or a C2 to C30 alkynyl group where at least one hydrogen is replaced by a cyano group. The cyano-containing group also refers to a divalent group such as a dicyanoalkenyl group represented by $=CR^{x'}-(CR^xR^y)_p-CR^{y'}(CN)_2$ wherein $R^x$, $R^y$, $R^{x'}$, and $R^{y'}$ are the same or different and are independently one of hydrogen or a C1 to C10 alkyl group and p is an integer of 0 to 10 (and/or 1 to 10). Specific examples of the cyano-containing group may be a dicyanomethyl group, a dicyanovinyl group, a cyanoethynyl group, and the like.

As used herein, when a definition is not otherwise provided, "a heterocycle" refers to a cycle including at least one heteroatom, wherein the heteroatom may be one of N, O, S, P, or Si and the cycle may be an aliphatic cycle, an aromatic cycle, or a fused cycle (e.g., fused cyclic structure) thereof.

As used herein, when a definition is not otherwise provided, "any combination thereof" refers to at least two substituents bound to each other by a single bond or a C1 to C10 alkylene group, or at least two fused substituents.

As used herein, the term "5-membered aromatic ring" refers to a 5-membered cyclic group (e.g., C5 aryl group) having a conjugation structure or a 5-membered heterocyclic group (e.g., C2 to C4 heteroaryl group) having a conjugation structure. As used herein, the term "6-membered aromatic ring" refers to a 6-membered cyclic group (e.g., C6 aryl group) having a conjugation structure or a 6-membered heterocyclic group (e.g., C2 to C5 heteroaryl group) having a conjugation structure, but is not limited thereto. The aromatic ring may include the 5-membered aromatic ring or the 6-membered aromatic ring, but is not limited thereto.

It will further be understood that when an element is referred to as being "on" another element, it may be above or beneath or adjacent (e.g., horizontally adjacent) to the other element. It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%). Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%). Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%). It will be understood that elements and/or properties thereof may be recited herein as being "identical" to, "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%). When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, a compound according to some example embodiments (also referred to herein interchangeably as a novel compound) is described.

The compound according to some example embodiments is represented by Chemical Formula 1.

[Chemical Formula 1]

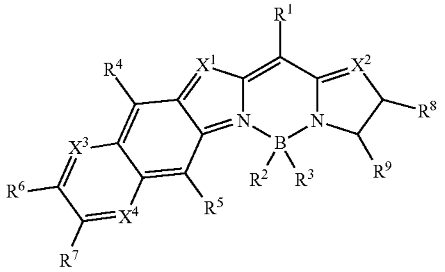

In Chemical Formula 1, $R^1$ is a substituted or unsubstituted C1 to C30 alkyl group, a substituted or unsubstituted C1 to C30 alkoxy group, a halogen, a cyano group, a nitro group, or any combination thereof, $R^2$ and $R^3$ are independently a halogen, $R^4$ to $R^9$ are independently hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C3 to C30 cycloalkenyl group, a substituted or unsubstituted C2 to C30 heteroalkenyl group, a substituted or unsubstituted C2 to C30 heterocycloalkenyl group, a substituted or unsubstituted C2 to C30 alkynyl group, a substituted or unsubstituted C3 to C30 cycloalkynyl group, a substituted or unsubstituted C2 to C30 heteroalkynyl group, a substituted or unsubstituted C2 to C30 heterocycloalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C2 to C30 aryloxy group, or any combination thereof, wherein $R^6$ and $R^7$, $R^8$ and $R^9$, or both of them (e.g., at least one pair of a pair of $R^6$ and $R^7$ or a pair of $R^8$ and $R^9$) may be linked to each other to form at least one substituted or unsubstituted fused ring, In some example embodiments, none of $R^6$ and $R^7$ or $R^8$ and $R^9$, are linked to each other, such that the aforementioned substituted or unsubstituted fused ring is absent (e.g., such that there is no substituted or unsubstituted fused ring therebetween).

$X^1$ to $X^4$ are independently N or $CR^a$, wherein R a is hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C1 to C30 heteroalkenyl group, a substituted or unsubstituted C2 to C30 alkynyl group, a substituted or unsubstituted C1 to C30 heteroalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof.

The compound represented by Chemical Formula 1 includes an electron acceptor moiety, so called "BODIPY (boron-dipyrromethene)", in which boron is substituted with $R^2$ and $R^3$, which are halogens, and linked to two nitrogen atoms each of which is included in a pyrrole-derivative ring disposed in each side of boron, and the two pyrrole-derivative rings are linked through a methenylene group substituted with an electron withdrawing group $R^1$. The compound further includes a fused structure in which a benzene ring is fused to one of the two pyrrole-derivative rings, and additional fused 6-membered conjugated ring is fused to the benzene ring in a specific linear direction. As such, the compound also includes an electron donor moiety by including the benzene ring fused to the pyrrole-derivative ring, and the additional 6-membered conjugated ring, which are fused in a specific linear direction.

Therefore, the compound represented by Chemical Formula 1 has at least one electron acceptor moiety and at least one electron donor moiety in one molecule, and thus, may have strong charge transfer characteristics and may effectively absorb light in a near-infrared wavelength region due to low bandgap energy. In addition, the compound has improved thermal stability and may be appropriate for a deposition process. Accordingly, the compound represented by Chemical Formula 1 may be configured to be a near-infrared absorber and, when included in a photoelectric conversion device (also referred to herein as a photoelectric device), may configure the device to have improved absorption of incident light in a near-infrared wavelength region (also referred to as having improved sensitivity to such light). As a result, a device (e.g., photoelectric device, sensor, any device including same, or the like) that includes the compound represented by Chemical Formula 1 may have improved functionality in that the device may be configured to detect (e.g., absorb and/or photoelectrically convert) near-infrared light with improved sensitivity and/or improved absorbance of near-infrared light based on including the compound represented by Chemical Formula 1 (e.g., based on including the compound represented by Chemical Formula 1 in an active layer of a photoelectric device).

It is desirable that a material absorbing light in a long wavelength like the near-infrared light has small HOMO-LUMO bandgap energy, also referred to herein as small bandgap energy, low bandgap energy, or the like. In order to have the small bandgap energy, a conjugation length thereof may be made to be longer, but when the conjugation length becomes long, a deposition process is difficult to apply. In the compound represented by Chemical Formula 1, substituents $R^6$ and $R^7$, substituted to the conjugated structure, and/or substituents $R^8$ and $R^9$, substituted to the pyrrole-derivative ring to which a conjugated ring is not fused, may be linked to each other to form an additional fused ring. In this case, the compound represented by Chemical Formula 1 may include additional conjugated structure extended from the structure of Chemical Formula 1. Therefore, the compound according to some example embodiments (e.g., the compound represented by Chemical Formula 1) may easily be adjusted to have small bandgap energy, through which the compound may become advantageous to absorb light in a near-infrared wavelength region, and the addition of the fused structure may also be appropriately adjusted for a deposition process. Accordingly, the inclusion of the compound represented by Chemical Formula 1 in a device that is configured to sense (e.g., absorb and/or photoelectrically convert) incident light may improve the sensitivity and/or absorbance of the device with regard to light in the near-infrared wavelength region (also referred to herein as near-infrared light), which may improve the functionality of the device as a near-infrared light sensor.

The compound according to some example embodiments may have a molecular weight of less than or equal to about 750 grams per mole (g/mol), for example, less than or equal to about 700 g/mol, for example, greater than or equal to about 250 g/mol and less than or equal to about 750 g/mol, and thus, may easily be deposited. Further, the compound may be excellent in absorbing light in respectively long wavelength, for example, the compound may have a peak absorption wavelength (λmax) of, for example, greater than or equal to about 750 nanometers (nm), for example, greater than or equal to about 800 nm, greater than or equal to about 850 nm, greater than or equal to about 900 nm, greater than or equal to about 950 nm, or greater than or equal to about 1,000 nm. Accordingly, an active layer and/or structure (e.g., of a photoelectric device) that includes the compound as a near-infrared absorber may have improved sensitivity to and/or absorbance of light in a near-infrared wavelength region. Devices, for example, a sensor, which is configured to selectively absorb and/or transfer (e.g., photoelectrically convert) light in near-infrared wavelength to, for example, electric signal, for example, photoelectric conversion, may include the compound in an active layer to have improved operational performance and/or efficiency.

The compound represented by Chemical Formula 1 is a novel compound that may absorb light in a near-infrared wavelength region. The compound may have a peak absorption wavelength (λmax) of, for example, about 750 nm to about 3000 nm, about 800 nm to about 2500 nm, about 1000 nm to about 2000 nm, about 1000 nm to about 1800 nm, about 1200 nm to about 1800 nm, or about 1300 nm to about 1500 nm.

In Chemical Formula 1, $R^1$ may be a substituted or unsubstituted C1 to C10 alkyl group, a substituted or unsubstituted C1 to C10 alkoxy group, a halogen, a cyano group, a nitro group, or any combination thereof. For example, and $R^1$ may be a halogen-substituted C1 to C10 alkyl group, for example, trifluoromethyl group ($—CF_3$), a substituted or unsubstituted C1 to C5 alkoxy group, halogen atom, for example, fluorine, chlorine, bromine, or iodine, cyano group, nitro group, or any combination thereof, such that $R^1$ may become an electron withdrawing group. In some example embodiments, $R^1$ is a halogen-substituted C1 to C4 alkyl group, an unsubstituted C1 to C4 alkoxy group, a cyano group, or any combination thereof. In some example embodiments, $R^1$ may be a trifluoromethyl group ($—CF_3$), or a cyano group.

$R^2$ and $R^3$ may independently be fluorine, chlorine, bromine, or iodine, for example, fluorine, chlorine, or bromine, or for example, fluorine.

In Chemical Formula 1, (i) all of $X^1$ to $X^4$ may independently be $CR^a$, wherein $R^a$ may be the same as defined above, (ii) all of $X^1$ to $X^4$ may independently be N, (iii) $X^1$ and $X^2$ may independently be $CR^a$, wherein $R^a$ may be the same as defined above, and $X^3$ and $X^4$ may independently be N, (iv) $X^1$ and $X^2$ may independently be N, and $X^3$ and $X^4$ may independently be $CR^a$, wherein $R^a$ may be the same as defined above, (v) one of $X^1$ or $X^2$ may be N, the other (e.g., another one of $X^1$ or $X^2$) may be $CR^a$, wherein R a may be the same as defined above, and $X^3$ and $X^4$ may independently be $CR^a$, wherein R a may be the same as defined above, (vi) one of $X^1$ or $X^2$ may be N, the other may be $CR^a$, wherein R a may be the same as defined above, and $X^3$ and $X^4$ may independently be N, or (vii) one of $X^1$ or $X^2$ may be N, the other may be $CR^a$, wherein R a may be the same as defined above, and one of $X^3$ or $X^4$ may be N, and the other (e.g., another one of $X^3$ or $X^4$) may be $CR^a$, wherein R a may be the same as defined above, and are not limited thereto.

As described above, in the compound represented by Chemical Formula 1, the two substituents substituted to the conjugated structure and/or the two substituents substituted to the pyrrole-derivative ring may be linked to each other to form at least one substituted or unsubstituted fused ring. For example, the compound may include additional at least one substituted or unsubstituted fused ring fused in a specific direction [f] from the pyrrole-derivative ring.

The at least one substituted or unsubstituted fused ring may include a substituted or unsubstituted C3 to C30 cycloaliphatic group, a substituted or unsubstituted C3 to C30 hetero cycloaliphatic group, a substituted or unsubstituted C6 to C30 aryl group, a substituted or unsubstituted C3 to C30 heteroaryl group, or any combination thereof, and is not limited thereto. The at least one substituted or unsubstituted fused ring may form one or more additional conjugated structures with the conjugated structure of Chemical Formula 1, or may not form additional conjugated structures. As the compound of Chemical Formula 1 already includes at least one conjugated structure therein, the compound may exhibit sufficient absorbing characteristics of light in a near-infrared wavelength region. The at least one substituted or unsubstituted fused ring may be present as any fused ring, as long as it (e.g., the at least one substituted or unsubstituted fused ring) does not deteriorate properties of the compound represented by Chemical Formula 1.

For example, the at least one substituted or unsubstituted fused ring may include substituted or unsubstituted benzene, substituted or unsubstituted naphthalene, substituted or unsubstituted anthracene, substituted or unsubstituted phenanthrene, substituted or unsubstituted naphthacene, substituted or unsubstituted pyrene, substituted or unsubstituted pentalene, substituted or unsubstituted indene, substituted or unsubstituted indan, substituted or unsubstituted tetralin, substituted or unsubstituted azulene, substituted or unsubstituted fluorene, substituted or unsubstituted acenaphthylene, or substituted or unsubstituted acenaphthene, substituted or unsubstituted pyrrole, substituted or unsubstituted pyrrolidine, substituted or unsubstituted pyrazole, substituted or unsubstituted imidazole, substituted or unsubstituted pyrazoline, substituted or unsubstituted imidazoline, substituted or unsubstituted pyrazolidine, substituted or unsubstituted imidazolidine, substituted or unsubstituted pyridine, substituted or unsubstituted pyrimidine, substituted or unsubstituted pyridazine, substituted or unsubstituted pyrazine, substituted or unsubstituted indole, substituted or unsubstituted isoindole, substituted or unsubstituted indoline, substituted or unsubstituted isoindoline, substituted or unsubstituted quinazoline, substituted or unsubstituted quinoxaline, substituted or unsubstituted 1,8-naphthyridine, substituted or unsubstituted phthalazin, substituted or unsubstituted pteridine, substituted or unsubstituted carbazole, substituted or unsubstituted acridine, substituted or unsubstituted phenazine, or any combination thereof, and is not limited thereto.

In some example embodiments, the at least one substituted or unsubstituted fused ring may include substituted or unsubstituted benzene, substituted or unsubstituted naphthalene, substituted or unsubstituted anthracene, substituted or unsubstituted acenaphthene, substituted or unsubstituted pyrrole, substituted or unsubstituted pyrrolidine, substituted or unsubstituted pyrazole, substituted or unsubstituted imidazole, substituted or unsubstituted pyrazoline, substituted or unsubstituted imidazoline, substituted or unsubstituted pyrazolidine, substituted or unsubstituted imidazolidine, substituted or unsubstituted pyridine, substituted or unsubstituted pyrimidine, substituted or unsubstituted pyridazine, substituted or unsubstituted pyrazine, substituted or unsubstituted indole, substituted or unsubstituted isoindole, substituted or unsubstituted indoline, substituted or unsubstituted isoindoline, substituted or unsubstituted carbazole, or any combination thereof, and is not limited thereto. For example, the at least one substituted or unsubstituted fused ring may include substituted or unsubstituted benzene, substituted or unsubstituted naphthalene, substituted or unsubstituted benzene, substituted or unsubstituted naphthalene, substituted or unsubstituted pyrazine, substituted or unsubstituted pyrimidine, or any combination thereof, and is not limited thereto.

In Chemical Formula 1, $R^4$ to $R^9$ may independently be hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof, wherein $R^6$ and $R^7$, $R^8$ and $R^9$, or both of them (e.g., both of the pairs $R^6$ and $R^7$ and $R^8$ and $R^9$ may be linked to each other to form at least one substituted or unsubstituted fused ring. In some example embodiments, none of $R^6$ and $R^7$ or $R^8$ and $R^9$, are linked to each other, such that the aforementioned substituted or unsubstituted fused ring is absent (e.g., such that there is no substituted or unsubstituted fused ring therebetween).

In some example embodiments, $X^1$ and $X^2$ may independently be N, $X^3$ and $X^4$ may independently be $CR^a$, wherein $R^a$ may be hydrogen, deuterium, a halogen, a substituted or unsubstituted C1 to C10 alkyl group, a substituted or unsubstituted C1 to C5 alkoxy group, or any combination thereof, and $R^4$ to $R^9$ may independently be hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof, wherein $R^6$ and $R^7$, $R^8$ and $R^9$, or both of them may be linked to each other to form at least one substituted or unsubstituted fused ring. In some example embodiments, none of $R^6$ and $R^7$ or $R^8$ and $R^9$, are linked to each other, such that the aforementioned substituted or unsubstituted fused ring is absent (e.g., such that there is no substituted or unsubstituted fused ring therebetween).

In some example embodiments, $X^1$ and $X^2$ may independently be $CR^a$, wherein $R^a$ may be hydrogen, deuterium, a halogen, a substituted or unsubstituted C1 to C10 alkyl group, a substituted or unsubstituted C1 to C5 alkoxy group, or any combination thereof, $X^3$ and $X^4$ may independently be N, and $R^4$ to $R^9$ may independently be hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof, wherein $R^6$ and $R^7$, $R^8$ and $R^9$, or both of them (e.g., at least one pair of a pair of $R^6$ and $R^7$ or a pair of $R^8$ and $R^9$) may be linked to each other to form at least one substituted or unsubstituted fused ring. In some example embodiments, none of $R^6$ and $R^7$ or $R^8$ and $R^9$, are linked to each other, such that the aforementioned substituted or unsubstituted fused ring is absent (e.g., such that there is no substituted or unsubstituted fused ring therebetween).

In some example embodiments, $X^1$, $X^3$ and $X^4$ may independently be $CR^a$, wherein $R^a$ may be hydrogen, deuterium, a halogen, a substituted or unsubstituted C1 to C10 alkyl group, a substituted or unsubstituted C1 to C5 alkoxy group, or any combination thereof, $X^2$ may be N, and $R^4$ to $R^9$ may independently be hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof, wherein $R^6$ and $R^7$, $R^8$ and $R^9$, or both of them may be linked to each other to form at least one substituted or unsubstituted fused ring. In some example embodiments, none of $R^6$ and $R^7$ or $R^8$ and $R^9$, are linked to each other, such that the aforementioned substituted or unsubstituted fused ring is absent (e.g., such that there is no substituted or unsubstituted fused ring therebetween).

In some example embodiments, $X^1$ to $X^4$ may independently be $CR^a$, wherein $R^a$ may be hydrogen, deuterium, a halogen, a substituted or unsubstituted C1 to C10 alkyl group, a substituted or unsubstituted C1 to C5 alkoxy group, or any combination thereof, and $R^4$ to $R^9$ may independently be hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof, wherein $R^6$ and $R^7$, $R^8$ and $R^9$, or both of them may be linked to each other to form at least one substituted or unsubstituted fused ring. In some example embodiments, none of $R^6$ and $R^7$ or $R^8$ and $R^9$, are linked to each other, such that the aforementioned substituted or unsubstituted fused ring is absent (e.g., such that there is no substituted or unsubstituted fused ring therebetween).

In some example embodiments, $R^1$ may be a trifluoromethyl group, or a cyano group, $R^2$ and $R^3$ may independently be fluorine, $R^4$ to $R^9$ may independently be hydrogen, deuterium, a halogen, a substituted or unsubstituted C1 to C10 alkyl group, a substituted or unsubstituted C3 to C6 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C10 aryl group, a substituted or unsubstituted C1 to C5 alkoxy group, or any combination thereof, wherein $R^8$ and $R^9$, or both of them may be linked to each other to form at least one substituted or unsubstituted fused ring, and $X^1$ to $X^4$ may independently be N or —CH.

In some example embodiments, $R^1$ may be a halogen-substituted C1 to C4 alkyl group, or a cyano group, $R^2$ and $R^3$ may independently be a halogen (e.g., fluorine), $R^4$ to $R^9$ may independently be hydrogen, deuterium, a halogen, a substituted or unsubstituted C1 to C10 alkyl group, a substituted or unsubstituted C3 to C6 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C10 aryl group, a substituted or unsubstituted C1 to C5 alkoxy group, or any combination thereof, wherein $R^8$ and $R^9$, or both of them may be linked to each other to form at least one substituted or unsubstituted fused ring, and $X^1$ to $X^4$ may independently be N or —CH.

The compound represented by Chemical Formula 1 may include (e.g., may be) a compound represented by Chemical Formula 2:

[Chemical Formula 2]

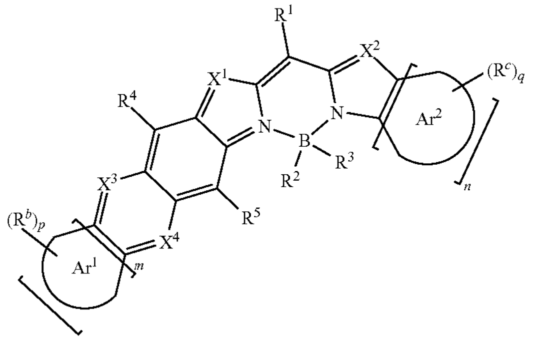

In Chemical Formula 2, $R^1$ to $R^5$, and $X^1$ to $X^4$ may independently be the same as defined in Chemical Formula 1 (e.g., independently the same as $R^1$ to $R^5$, and $X^1$ to $X^4$ of Chemical Formula 1), $R^b$ and $R^c$ may independently be a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, or any combination thereof, $Ar^1$ and $Ar^2$ may independently be a substituted or unsubstituted C3 to C30 cycloaliphatic group, a substituted or unsubstituted C3 to C30 hetero cycloaliphatic group, a substituted or unsubstituted C6 to C30 aryl group, a substituted or unsubstituted C3 to C30 heteroaryl group, or any combination thereof, m and n may independently be an integer ranging from 0 to 7, provided 0 m+n≤7, wherein if m and n are independently an integer greater than or equal to 2, then two or more $Ar^1$ of Chemical Formula 2 may be the same as or different from each other, and two or more $Ar^2$ of Chemical Formula 2 may be the same as or different from each other, and p and q may independently be an integer greater than or equal to 0, provided that they (e.g., p and q) are not greater than the valence of $Ar^1$ and $Ar^2$, respectively.

As described in Chemical Formula 2, in some example embodiments, the compound represented by Chemical Formula 1 may have an additional fused ring attached to the basic conjugated structure and/or to the pyrrole-derivative ring to which a conjugated structure was not attached. As such, 1 (one) to 7 (seven) additional fused ring(s) may be made, and the number and/or size of the fused ring(s) may be appropriately adjusted upon considering application of the compound.

In some example embodiments, m and n of Chemical Formula 2 may independently be an integer ranging from 0 to 3 or 0 to 2, for example, m may be an integer from 0 to 2, and n may be an integer from 1 to 3, and for example, m may be 0 or 1, and n may be 1 or 2.

In Chemical Formula 2, the additional fused ring $Ar^1$ and $Ar^2$ may independently be a substituted or unsubstituted benzene, substituted or unsubstituted naphthalene, substituted or unsubstituted indene, substituted or unsubstituted indan, substituted or unsubstituted pyrrole, substituted or unsubstituted pyrrolidine, substituted or unsubstituted pyrazole, substituted or unsubstituted imidazole, substituted or unsubstituted pyrazoline, substituted or unsubstituted imidazoline, substituted or unsubstituted pyrazolidine, substituted or unsubstituted imidazolidine, substituted or unsubstituted pyridine, substituted or unsubstituted pyridazine, substituted or unsubstituted pyrazine, substituted or unsubstituted indole, substituted or unsubstituted isoindole, substituted or unsubstituted indoline, substituted or unsubstituted isoindoline, substituted or unsubstituted quinazoline, substituted or unsubstituted quinoxaline, substituted or unsubstituted 1,8-naphthyridine, substituted or unsubstituted phthalazin, substituted or unsubstituted pteridine, substituted or unsubstituted carbazole, substituted or unsubstituted acridine, substituted or unsubstituted phenazine, or any combination thereof, and are not limited thereto. For example, $Ar^1$ and $Ar^2$ may independently be a substituted or unsubstituted benzene, substituted or unsubstituted pyrrole, substituted or unsubstituted pyrrolidine, substituted or unsubstituted pyrazole, substituted or unsubstituted imidazole, substituted or unsubstituted pyrazoline, substituted or unsubstituted imidazoline, substituted or unsubstituted pyrazolidine, substituted or unsubstituted imidazolidine, substituted or unsubstituted pyridine, substituted or unsubstituted pyridazine, substituted or unsubstituted pyrazine, substituted or unsubstituted indole, substituted or unsubstituted isoindole, substituted or unsubstituted indoline, substituted or unsubstituted isoindoline, substituted or unsubstituted carbazole, or any combination thereof, and are not limited thereto. For example, $Ar^1$ and $Ar^2$ may independently be a substituted or unsubstituted benzene, substituted or unsubstituted naphthalene, substituted or unsubstituted pyrazine, substituted or unsubstituted pyrimidine, or any combination thereof.

The compound represented by Chemical Formula 1 may include a compound represented by Chemical Formula 3:

[Chemical Formula 3]

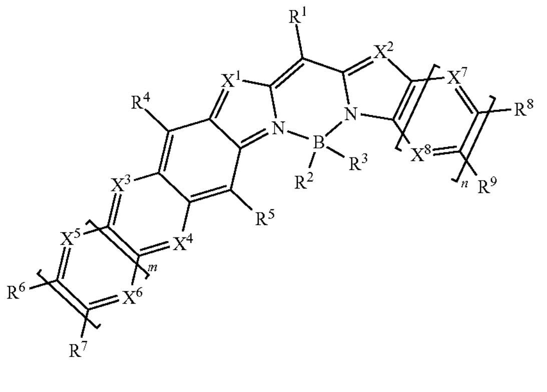

In Chemical Formula 3, $R^1$ to $R^9$, and $X^1$ to $X^4$ may independently be the same as defined in Chemical Formula 1 (e.g., $R^1$ to $R^9$, and $X^1$ to $X^4$ may independently be the same as $R^1$ to $R^9$, and $X^1$ to $X^4$ of Chemical Formula 1), $X^5$ to $X^8$ may independently be the same as defined in $X^1$ to $X^4$, respectively, for example $X^5$ to $X^8$ may independently be N or $CR^a$, wherein R a is hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 heteroalkenyl group, a substituted or unsubstituted C2 to C30 alkynyl group, a substituted or unsubstituted C2 to C30 heteroalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof, m and n may independently be an integer ranging from 0 to 7, provided 0 m+n≤7, wherein if m and n are independently an integer greater than or equal to 2, then each $X^5$ to $X^8$ included in each repeating structure of Chemical Formula 3 is the same as or different from each $X^5$ to $X^8$ included in other repeating structures of Chemical Formula 3.

In Chemical Formula 3, m and n may independently be an integer ranging from 0 to 4 or 0 to 3, for example, m may be an integer from 0 to 2, and n may be an integer from 1 to 3. For example, m may be 0 or 1, and n may be an integer from 1 to 4.

For example, if m is 0 and n is 2, then the compound represented by Chemical Formula 3 may have the same number (e.g., quantity) of conjugated structures fused and extended from each pyrrole-derivative ring that is linked to boron atom. In this case, for example, if $X^1$ and $X^2$ are the same, $X^7$ and $X^8$ in the first fused ring are the same as $CR^4$ and $CR^5$, respectively, $X^7$ and $X^8$ in the second fused ring are the same as $X^3$ and $X^4$, respectively, $R^6$ and $R^8$ are the same, and $R^7$ and $R^9$ are the same, then the compound represented by Chemical Formula 3 has symmetry in its structure.

As such, the compounds represented by Chemical Formula 1, Chemical Formula 2, or Chemical Formula 3 may have symmetry structures with respect to boron atom that links two pyrrole-derived rings (e.g., two pyrrole-derivative rings), or may not have symmetry structure in which the number of fused rings attached to the two pyrrole-derivative rings are different or the structures of the fused rings are different. In some example embodiments, if the compound has a symmetry structure, the compound may have an electron acceptor moiety at its center, and electron donor moieties at two sides of the compound, and thus, may have ‘donor-acceptor-donor’ structure. By having ‘donor-acceptor-donor’ structure, the compound may further effectively absorb light in a near-infrared wavelength region by having further strong charge transfer characteristics, as well as much lowered energy bandgap, such that a device (e.g., a photoelectric device) that is configured to sense or detect (e.g., absorb and/or photoelectrically convert) incident light may have improved sensitivity and/or absorbance with regard to light in the near-infrared wavelength region based on the device including the compound (e.g., in an active layer of a photoelectric device), thereby improving the near-infrared detection functionality of the device.

In Chemical Formula 3, (i) all of $X^1$ to $X^8$ may independently be $CR^a$, wherein $R^a$ is the same as defined above, for example $R^a$ is hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 heteroalkenyl group, a substituted or unsubstituted C2 to C30 alkynyl group, a substituted or unsubstituted C2 to C30 heteroalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof, (ii) all of $X^1$ to $X^8$ are independently N, (iii) $X^1$ and $X^2$ may independently be $CR^a$, wherein $R^a$ is defined as above, and $X^3$ to $X^8$ may independently be N, (iv) $X^1$ and $X^2$ may independently be N, and $X^3$ to $X^8$ may independently be $CR^a$, wherein $R^a$ is defined as above, (v) one of $X^1$ or $X^2$ may be N, the other may be $CR^a$, wherein $R^a$ is defined as above, and $X^3$ to $X^8$ may independently be $CR^a$, wherein $R^a$ is defined as above, (vi) one of $X^1$ or $X^2$ may be N, the other may be $CR^a$, wherein $R^a$ is defined as above, and $X^3$ to $X^8$ may independently be N, or (vii) one of $X^1$ or $X^2$ may be N, the other may be $CR^a$, wherein R a is defined as above, $X^3$ and $X^4$ may independently be N, and all of $X^5$ to $X^8$ may independently be $CR^a$, wherein R a is defined as above, (viii) one of $X^1$ or $X^2$ may be N, the other may be $CR^a$, wherein R a is defined as above, $X^3$ and $X^4$ may independently be $CR^a$, wherein R a is defined as above, $X^5$ and $X^6$ may independently be N, and $X^7$ and $X^8$ may independently be $CR^a$, wherein R a is defined as above, (ix) one of $X^1$ or $X^2$ may be N, the other may be $CR^a$, wherein R a is defined as above, $X^3$ and $X^4$ may independently be $CR^a$, wherein R a is defined as above, one or more of $X^5$ to $X^8$ may independently be N, or (x) one of $X^1$ or $X^2$ may be N, the other may be $CR^a$, wherein R a is defined as above, $X^3$ and $X^4$ may independently be N, and one or more of $X^5$ to $X^8$ may independently be $CR^a$, wherein R a is defined as above, and are not limited thereto.

The compound according to some example embodiments may include any one of the following compounds, and is not limited thereto:

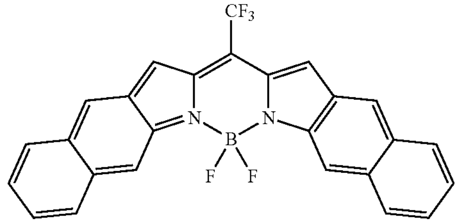

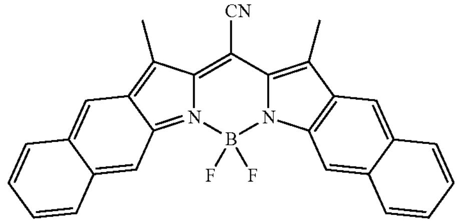

-continued
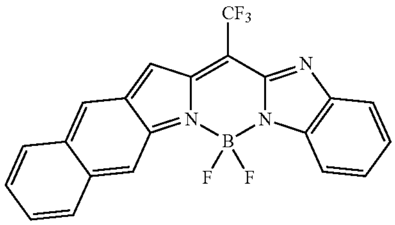
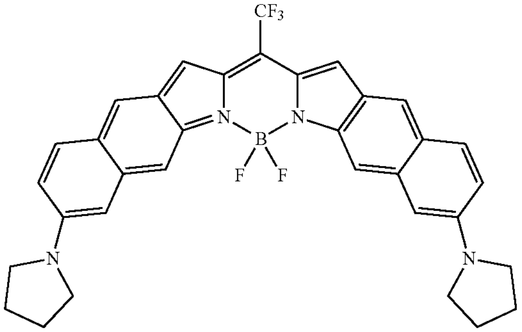
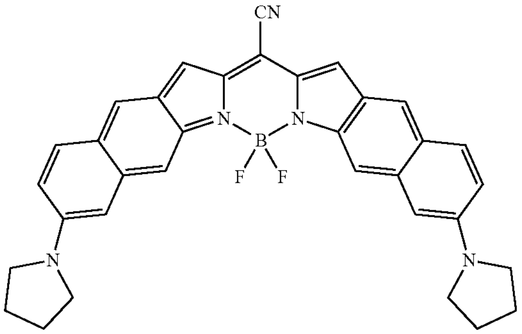
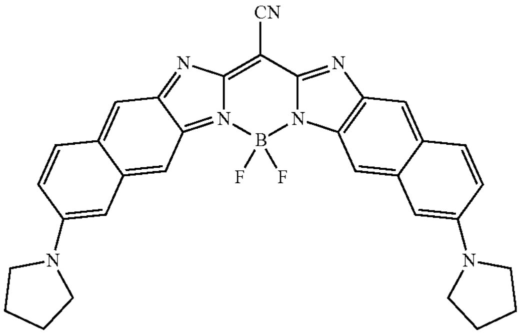
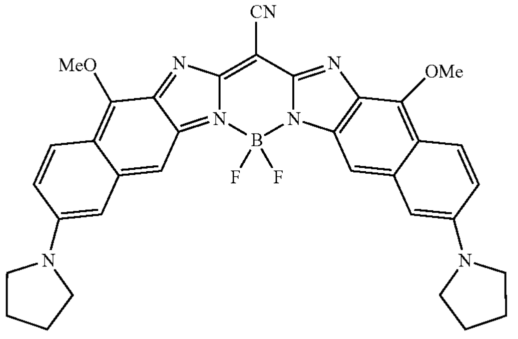
-continued
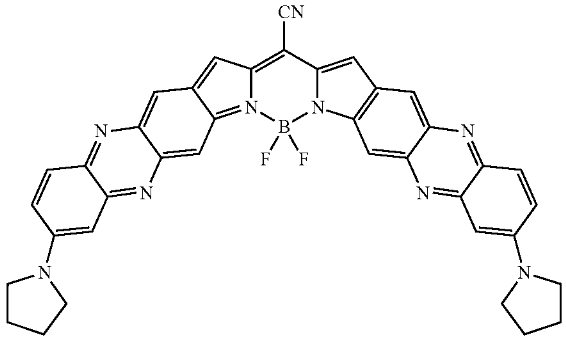
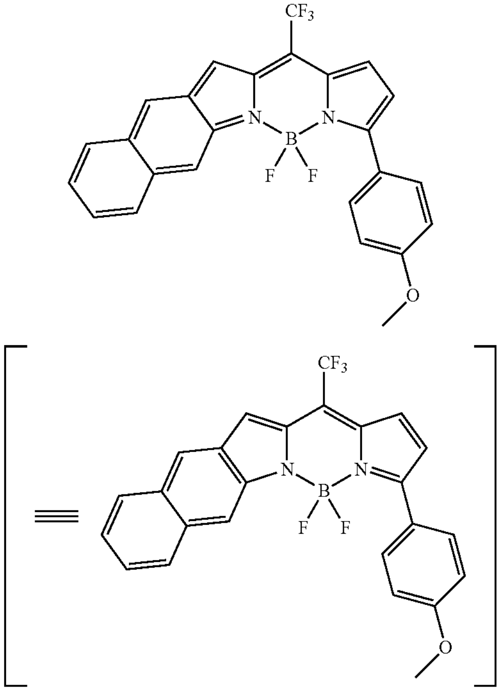
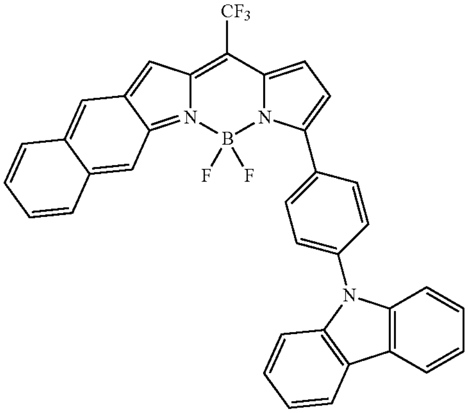
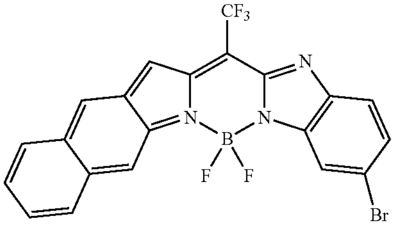

-continued

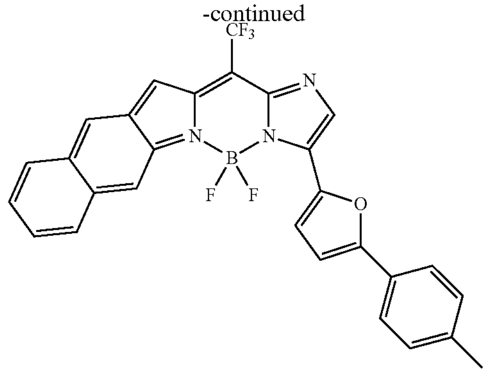

As described above, the compound according to some example embodiments (e.g., the compound represented by Chemical Formula 1) may have a molecular weight of about 250 g/mol to about 750 g/mol. Although the range may be appropriate for being applied by deposition process, the molecular weight of the compound is not limited thereto.

The compound may have a peak absorption wavelength (Amax) of, for example, greater than or equal to about 750 nm, greater than or equal to about 770 nm, greater than or equal to about 780 nm, greater than or equal to about 790 nm, greater than or equal to about 800 nm, greater than or equal to about 810 nm, greater than or equal to about 820 nm, or greater than or equal to about 830 nm. The compound may have a peak absorption wavelength (Amax) of, for example, about 750 nm to about 3000 nm, about 750 nm to about 2500 nm, about 780 nm to about 2200 nm, about 790 nm to about 2100 nm, about 800 nm to about 2000 nm, about 810 nm to about 2000 nm, about 820 nm to about 2000 nm, about 830 nm to about 2000 nm, about 850 nm to about 2000 nm, about 900 nm to about 2000 nm, about 950 nm to about 2000 nm, about 950 nm to about 1800 nm, about 1000 nm to about 1800 nm, about 1100 nm to about 1800 nm, about 1150 nm to about 1800 nm, about 1200 nm to about 1800 nm, about 1250 nm to about 1700 nm, about 1300 nm to about 1700 nm, about 1300 nm to about 1600 nm, or about 1300 nm to about 1500 nm.

Accordingly, the compound according to some example embodiments may absorb light in a near-infrared wavelength region.

The compound according to some example embodiments may exhibit good charge transfer characteristics, and thus, the compound may have good photoelectric conversion characteristics that absorb (e.g., selectively absorb) light and/or convert it (e.g., photoelectrically convert it) into an electrical signal, and thus may be effectively used as a photoelectric conversion material for photoelectric devices. Accordingly, a photoelectric device that includes the compound, for example in an active layer and/or charge auxiliary layer of the photoelectric device (e.g., active layer 30 shown in FIGS. 1 and 2 and/or charge auxiliary layers 40 and 45 shown in FIG. 2) may have improved operational performance and/or efficiency (e.g., improved light sensing and/or photoelectric conversion functionality) with regard to at least light in the near-infrared wavelength region, for example having improved operational performance and/or efficiency with regard to implementing photoelectric conversion of incident near-infrared light, based on including the compound according to some example embodiments.

The compound according to some example embodiments may have good heat resistance, and thus may prevent or reduce thermal decomposition during deposition, and thus may be repeatedly deposited. The compound according to some example embodiments may be thermally or vacuum deposited and may be deposited, for example, by sublimation. For example, deposition by sublimation may be confirmed by thermogravimetric analysis (TGA), and at a thermogravimetric analysis at a pressure of less than or equal to about 10 Pa, a temperature at which a 10% weight loss relative to an initial weight may be less than or equal to about 400° C., for example less than or equal to about 390° C., less than or equal to about 380° C., or less than or equal to about 370° C. For example, at a thermogravimetric analysis of the near-infrared absorber at a pressure of less than or equal to about 10 Pa, for example temperature at which a 10% weight loss relative to an initial weight may be about 230° C. to about 400° C.

Some example embodiments provide a near-infrared absorbing/blocking film including the compound according to some example embodiments (e.g., the compound represented by Chemical Formula 1).

The near-infrared absorbing/blocking film may be applied to various fields requiring light absorption characteristics in a near-infrared wavelength region.

The compound according to some example embodiments has both light absorption characteristics and photoelectric characteristics in a near-infrared wavelength region, and thus it may be effectively used as a photoelectric conversion material.

FIG. 1 is a cross-sectional view of a photoelectric device according to some example embodiments.

Referring to FIG. 1, a photoelectric device 100 according to some example embodiments includes a first electrode 10 and a second electrode 20 facing each other and an active layer 30 disposed between the first electrode 10 and the second electrode 20.

A substrate (not shown) may be disposed at the side of the first electrode 10 or the second electrode 20. The substrate may be for example made of (e.g., may at least partially comprise) an inorganic material such as glass; an organic material such as polycarbonate, polymethylmethacrylate, polyethyleneterephthalate, polyethylenenaphthalate, polyamide, polyethersulfone, or any combination thereof; or a silicon wafer. The substrate may be omitted.

One of the first electrode 10 or the second electrode 20 is an anode and the other is a cathode. For example, the first electrode 10 may be a cathode and the second electrode 20 may be an anode.

At least one of the first electrode 10 or the second electrode 20 may be a light-transmitting electrode and the light-transmitting electrode may be for example made of a conductive oxide such as an indium tin oxide (ITO), indium zinc oxide (IZO), zinc oxide (ZnO), tin oxide ($SnO_2$), aluminum tin oxide (AlTO), and/or fluorine doped tin oxide (FTO), or a metal thin layer of a single layer or a multilayer. When one of the first electrode 10 or the second electrode 20 is a non-light-transmitting electrode, it may be made of for example an opaque conductor such as aluminum (Al), silver (Ag), or gold (Au). For example, the first electrode 10 and the second electrode 20 may be all light-transmitting electrodes. For example, the second electrode 20 may be a light receiving electrode disposed at a light receiving side.

The active layer 30 is a layer including a p-type semiconductor and an n-type semiconductor configured to provide a pn junction, which is a layer that may produce excitons by receiving light from outside (e.g., an exterior of the active layer 30) and then separating holes and electrons from the produced excitons.

The p-type semiconductor and the n-type semiconductor may be independently a light absorbing material that is configured to absorb (e.g., selectively absorb) light in at least one portion of a wavelength region and the aforementioned compound according to some example embodiments (which may be configured to be a near-infrared absorber) may be a p-type semiconductor or an n-type semiconductor. For example, the aforementioned compound according to some example embodiments (which may be a near-infrared absorber) may be included in the active layer 30 as a p-type semiconductor and fullerene or a fullerene derivative may be included in the active layer 30 as an n-type semiconductor. Accordingly, it will be understood that the active layer 30 may at least partially comprise the aforementioned compound according to some example embodiments, for example as a near-infrared absorber (e.g., may include the compound as a near-infrared absorber and further include either fullerene or a fullerene derivative). Additionally, it will be understood that the active layer 30 may have a peak absorption wavelength (Amax) of, for example, greater than or equal to about 750 nm, greater than or equal to about 770 nm, greater than or equal to about 780 nm, greater than or equal to about 790 nm, greater than or equal to about 800 nm, greater than or equal to about 810 nm, greater than or equal to about 820 nm, or greater than or equal to about 830 nm, or a peak absorption wavelength (Amax) of about 750 nm to about 3000 nm, about 750 nm to about 2500 nm, about 780 nm to about 2200 nm, about 790 nm to about 2100 nm, about 800 nm to about 2000 nm, about 810 nm to about 2000 nm, about 820 nm to about 2000 nm, or about 830 nm to about 2000 nm. The active layer 30, and thus the photoelectric device 100 may have improved near-infrared light absorption characteristics (e.g., may have improved sensitivity to light in a near-infrared wavelength region, improved absorbance of light in the near-infrared wavelength region, etc.) and thus improved photoelectric conversion performance and/or efficiency and/or improved thermal stability, and thus improved functionality with regard to sensing light in the near-infrared wavelength region, based on the active layer including the aforementioned compound according to some example embodiments, based on the active layer 30 including the aforementioned compound according to some example embodiments (e.g., the compound represented by Chemical Formula 1). In some example embodiments, the active layer 30 may be a near-infrared absorbing/blocking film that includes the aforementioned compound according to some example embodiments.

The active layer 30 may include an intrinsic layer (I layer) in which the aforementioned compound (e.g., p-type semiconductor) and fullerene or a fullerene derivative (e.g., n-type semiconductor) are co-deposited. Herein, the p-type semiconductor and the n-type semiconductor may be included in a volume ratio of about 1:9 to about 9:1, for example about 2:8 to about 8:2, about 3:7 to about 7:3, about 4:6 to about 6:4, or about 5:5.

The active layer 30 may further include a p-type layer and/or an n-type layer in addition to the intrinsic layer. The p-type layer may include the aforementioned compound according to some example embodiments, which may serve as a near-infrared absorber, (e.g., p-type semiconductor) and the n-type layer may include the aforementioned n-type semiconductor. For example, the active layer 30 may include the aforementioned compound according to some example embodiments and the aforementioned n-type semiconductor in various combinations of p-type layer/I layer, I layer/n-type layer, p-type layer/I layer/n-type layer, and the like.

The photoelectric device 100 may further include an auxiliary layer between the first electrode 10 and the active layer 30 and/or the second electrode 20 and the active layer 30. The auxiliary layer may be a charge auxiliary layer or an optical auxiliary layer.

Figure 2:
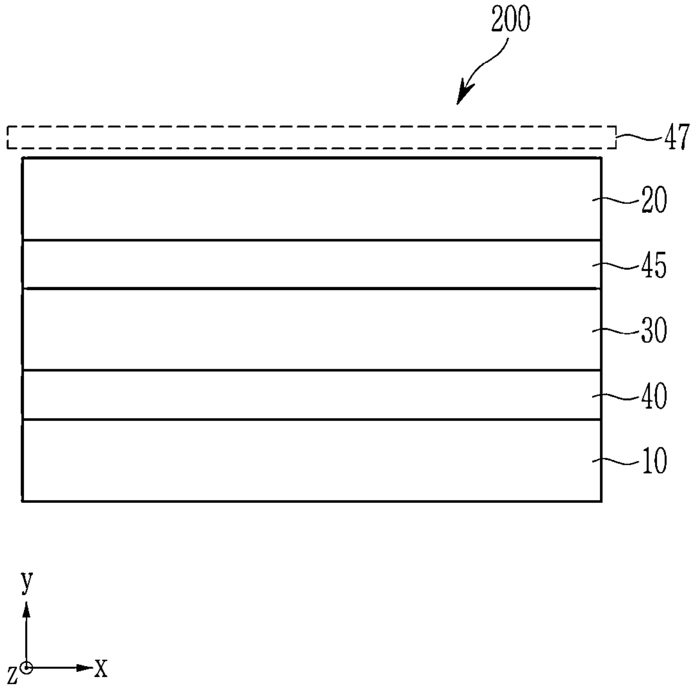
FIG. 2 is a cross-sectional view showing a photoelectric device according to some example embodiments.

This photoelectric device (e.g., optoelectronic device) is shown in FIG. 2.

FIG. 2 is a cross-sectional view showing a photoelectric device according to some example embodiments.

Referring to FIG. 2, a photoelectric device 200 includes a first electrode 10 and a second electrode 20 facing each other, an active layer 30 between the first electrode 10 and the second electrode 20, a first charge auxiliary layer 40 between the first electrode 10 and the active layer 30, and a second charge auxiliary layer 45 between the second electrode 20 and the active layer 30. In some example embodiments, only one of the first charge auxiliary layer 40 or the second charge auxiliary layer 45 is included in the photoelectric device 200.

The first charge auxiliary layer 40 and the second charge auxiliary layer 45 may each be a charge auxiliary layer that may make holes and electrons separated in the active layer 30 be transported more easily to improve efficiency of the photoelectric device 200.

The charge auxiliary layers may include at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 40 and/or 45 may include for example an organic material, an inorganic material, or an organic/inorganic material. The organic material may be an organic material having hole or electron characteristics and the inorganic material may be for example a metal oxide such as a molybdenum oxide, a tungsten oxide, or a nickel oxide.

The charge auxiliary layers 40 and 45 may include for example the aforementioned compound according to some example embodiments (e.g., the compound represented by Chemical Formula 1). In some example embodiments, the charge auxiliary layers 40 and/or 45 may include the aforementioned compound and the active layer 30 may also include the aforementioned compound. In some example embodiments, the charge auxiliary layers 40 and/or 45 may include the compound and the active layer 30 may not include the compound. The charge auxiliary layers 40 and/or 45, and thus the photoelectric device 200, may have improved near-infrared light absorption characteristics (e.g., may have improved sensitivity to light in a near-infrared wavelength region, improved absorbance of light in the near-infrared wavelength region, etc.) and thus improved photoelectric conversion performance and/or efficiency, and/or improved thermal stability based on the charge auxiliary layers 40 and/or 45 including the aforementioned near-infrared absorber.

The optical auxiliary layer may be disposed in the light incident direction of the photoelectric device. For example, when the second electrode 20 is a light receiving electrode (e.g., the electrode proximate to a surrounding environment from which light is received at the photoelectric device 200), the optical auxiliary layer may be disposed on the active layer 30. For example, the optical auxiliary layer may be disposed between the second electrode 20 and the active layer 30.

The photoelectric devices 100 and 200 may further include an anti-reflection layer 47 on one surface of the first electrode 10 or the second electrode 20. The anti-reflection layer 47 is disposed at a light incidence side and lowers reflectance of light of incident light and thereby light absorbance is further improved. For example, when light enters from the first electrode 10, the anti-reflection layer 47 may be disposed at an exposed surface of the first electrode 10 while when light enters from the second electrode 20, the anti-reflection layer may be disposed at an exposed surface of the second electrode 20.

The anti-reflection layer 47 may include, for example a material having a refractive index of about 1.6 to about 2.5 and may include for example at least one of a metal oxide, a metal sulfide, or an organic material having a refractive index within the ranges. The anti-reflection layer 47 may include, for example a metal oxide or chalcogen oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or any combination thereof; a metal sulfide such as zinc sulfide; or an organic material such as an amine derivative, but is not limited thereto.

In the photoelectric devices 100 and 200, when light enters said photoelectric device 100 and/or 200 and thus enters the active layer 30 thereof from (e.g., via) the first electrode 10 or the second electrode 20 and the active layer 30 thus absorbs the light in a particular (or, alternatively, predetermined) wavelength region, excitons may be generated there inside. The excitons are separated into holes and electrons in the active layer 30, and the separated holes are transported to an anode that is one of the first electrode 10 or the second electrode 20 and the separated electrons are transported to the cathode that is the other of the first electrode 10 and the second electrode 20 so as to flow (e.g., induce, generate, etc.) a current.

The photoelectric devices 100 and 200 may be applied to (e.g., included in) a solar cell, an image sensor, a photodetector, a photosensor, and an organic light emitting diode (OLED), but example embodiments are not limited thereto.

The photoelectric devices 100 and 200 may be applied to (e.g., included in) an organic sensor. The organic sensor may be an organic CMOS sensor, for example, an organic CMOS infrared light sensor or an organic CMOS image sensor.

In some example embodiments, the photoelectric device 100 may include the aforementioned compound (e.g., where the compound may be configured to serve as a near-infrared absorber) in any of the elements thereof, including, in addition to or alternative to the active layer 30, one or more of the first electrode 10 or the second electrode 20. In some example embodiments, the photoelectric device 200 may include the compound according to some example embodiments in any of the elements thereof, including, in addition to or alternative to the active layer 30 and/or one or more of the charge auxiliary layers 40/45, one or more of the first electrode 10 or the second electrode 20.

Figure 3:
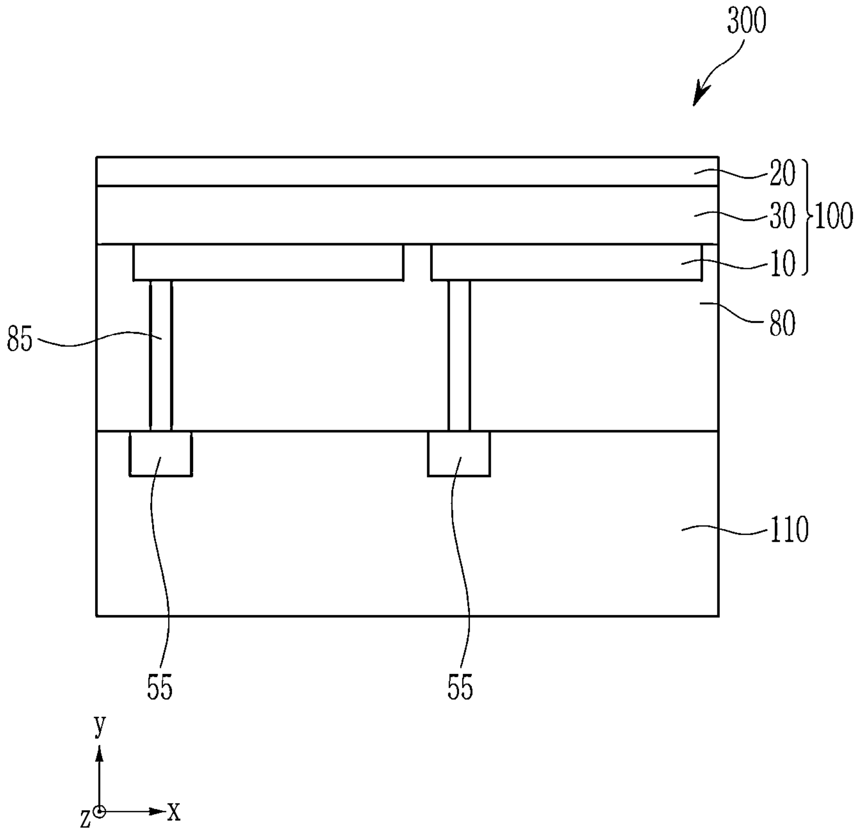
FIG. 3 is a cross-sectional view showing an organic sensor according to some example embodiments.

FIG. 3 is a cross-sectional view showing an organic sensor according to some example embodiments.

The organic sensor 300 according to some example embodiments includes a semiconductor substrate 110, an insulation layer 80, and a photoelectric device 100.

The semiconductor substrate 110 may be a silicon substrate and is integrated with a transmission transistor (not shown) and a charge storage 55. The charge storage 55 may be integrated in each pixel. The charge storage 55 is electrically connected to the photoelectric device 100 that is described previously and information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the semiconductor substrate 110.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and/or SiOF. The insulation layer 80 has a trench 85 exposing the charge storage 55. The trench 85 may be filled with fillers.

The aforementioned photoelectric device 100 is formed on the insulation layer 80. As described above, the photoelectric device 100 includes a first electrode 10, an active layer 30, and a second electrode 20. Even though a structure in which the first electrode 10, the active layer 30 and the second electrode 20 are sequentially stacked is shown as an example in the drawing, the present inventive concepts are not limited to this structure, and the second electrode 20, the active layer 30, and the first electrode 10 may be arranged in this order.

The first electrode 10 and the second electrode 20 may both be transparent electrodes, and the active layer 30 may be the same as described above with reference to FIGS. 1 and 2. The active layer 30 may selectively absorb light in a near-infrared wavelength region. Incident light from the side of the second electrode 20 may be photoelectrically converted by mainly absorbing light in a near-infrared wavelength region in the active layer 30. As noted above with reference to FIG. 1, the active layer 30 may include the compound according to some example embodiments and thus may have improved sensitivity to and/or improved absorbance of near-infrared light, such that the operational performance and/or efficiency of the organic sensor 300 in absorbing and/or converting incident near-infrared light into electrical signals (e.g., photoelectric conversion performance and/or efficiency) may be improved. As a result, the functionality of the organic sensor 300 with regard to sensing (e.g., absorbing and/or photoelectrically converting incident light in the near-infrared wavelength region) may be improved based on including the compound in the active layer 30.

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

Although the organic sensor to which the photoelectric device 100 of FIG. 1 is applied is illustrated in FIG. 3, the photoelectric device 200 according to FIG. 2 may be equally applied (e.g., included in place of photoelectric device 100 in the organic sensor 300).

The organic sensor according to some example embodiments may be an organic infrared light sensor, for example an iris sensor or a depth sensor.

The iris sensor identifies a person by using unique iris characteristics of every person and specifically, taking an image of an eye of a user within an appropriate distance, processing the image, and comparing it with his/her stored image.

The depth sensor identifies a shape and a location of an object from its three-dimensional information by taking an image of the object within an appropriate distance with a user and processing the image. This depth sensor may be for example used as a face recognition sensor.

Figure 4:
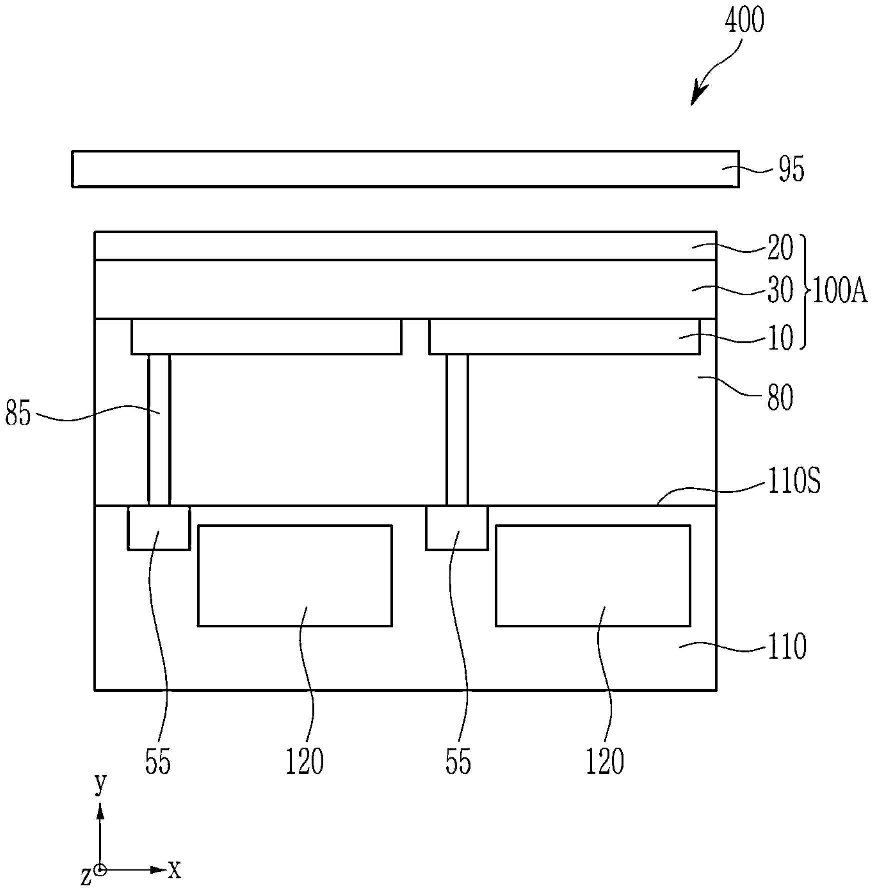
FIG. 4 is a cross-sectional view showing an organic sensor according to some example embodiments.

FIG. 4 is a cross-sectional view showing an organic sensor according to some example embodiments.

The organic sensor according to some example embodiments may include a plurality of sensors having different functions. For example, at least one of the plurality of sensors having different functions may be a biometric sensor, and the biometric sensor may be for example an iris sensor, a depth sensor, a fingerprint sensor, a blood vessel distribution sensor, and the like, but is not limited thereto. For example, one sensor of the plurality of sensors having different functions may be an iris sensor and another sensor of the plurality of sensors having different functions may be a depth sensor.

For example, a plurality of sensors may include, for example a first infrared light sensor configured to sense (e.g., selectively absorb and/or convert (into electrical signals, e.g., photoelectrically convert)) light in an infrared region having a first wavelength ($\lambda_1$) in an infrared wavelength region and a second infrared light sensor configured to sense (e.g., selectively absorb and/or convert (into electrical signals, e.g., photoelectrically convert)) light in an infrared region having a second wavelength ($\lambda_2$) in an infrared wavelength region (e.g., a same or different infrared wavelength region as the infrared wavelength region including the first wavelength ($\lambda_1$)).

The first wavelength ($\lambda_1$) and the second wavelength ($\lambda_2$) may be for example different in a wavelength region of about 750 nm to about 3000 nm, and for example a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

For example, one of the first wavelength ($\lambda_1$) or the second wavelength ($\lambda_2$) may belong to a wavelength region of about 780 nm to about 900 nm and the other of the first wavelength ($\lambda_1$) or the second wavelength ($\lambda_2$) may belong to a wavelength region of greater than about 900 nm and less than or equal to about 1000 nm.

For example, one of the first wavelength ($\lambda_1$) or the second wavelength ($\lambda_2$) may belong to a wavelength region of about 780 nm to about 840 nm and the other of the first wavelength ($\lambda_1$) or the second wavelength ($\lambda_2$) may belong to a wavelength region of about 910 nm to about 970 nm.

For example, one of the first wavelength ($\lambda_1$) or the second wavelength ($\lambda_2$) may belong to a wavelength region of about 800 nm to about 830 nm and the other of the first wavelength ($\lambda_1$) or the second wavelength ($\lambda_2$) may belong to a wavelength region of about 930 nm to about 950 nm.

For example, one of the first wavelength ($\lambda_1$) or the second wavelength ($\lambda_2$) may belong to a wavelength region of about 805 nm to about 815 nm and the other of the first wavelength ($\lambda_1$) or the second wavelength ($\lambda_2$) may belong to a wavelength region of about 935 nm to about 945 nm.

For example, one of the first wavelength ($\lambda_1$) or the second wavelength ($\lambda_2$) may be about 810 nm and the other of the first wavelength ($\lambda_1$) or the second wavelength ($\lambda_2$) may be about 940 nm.

The organic sensor 400 according to some example embodiments includes a dual bandpass filter 95, a first infrared light sensor 100A, an insulation layer 80, and a semiconductor substrate 110 integrated with a second infrared light sensor 120, such that the second infrared light sensor 120 is at least partially embedded within the semiconductor substrate 110. As shown in FIG. 4, the first infrared light sensor 100A and the second infrared light sensor 120 may be stacked, e.g., may overlap in a vertical direction that is perpendicular to the top surface 110S of the semiconductor substrate 110.

As shown in FIG. 4, dual bandpass filter 95 may be disposed on a front side of the organic sensor 400 and may selectively transmit infrared light (e.g., light in an infrared wavelength region) including the first wavelength ($\lambda_1$) and infrared light including the second wavelength ($\lambda_2$) and may block and/or absorb other light. Herein, other light may include light in an ultraviolet (UV) and visible region.

A first infrared light sensor 100A includes a first electrode 10, an active layer 30, and a second electrode 20. As shown in FIG. 4, the first infrared light sensor 100A may be the same as the photoelectric device 100 according to some example embodiments, including the example embodiments described with reference to FIG. 1, but it will be understood that, in some example embodiments, the first infrared light sensor 100A may be the same as the photoelectric device 200 according to some example embodiments, including the example embodiments described with reference to FIG. 2.

As shown in FIG. 4, the second infrared light sensor 120 may be integrated in the semiconductor substrate 110 and may be a photo-sensing device. The semiconductor substrate 110 (e.g., encompassed within a volume space defined by outer surfaces of the semiconductor substrate 110) may be for example a silicon substrate and may be integrated with the second infrared light sensor 120, the charge storage 55, and a transmission transistor (not shown).

The second infrared light sensor 120 may be a photodiode (e.g., a silicon-based photodiode) and may sense (e.g., absorb) entered light, and sensed information is transferred by the transmission transistor. Herein, the light entered into the second infrared light sensor 120 is light that passes through (e.g., is selectively transmitted by) the dual bandpass filter 95 and the first infrared light sensor 100A and may be infrared light in a particular (or, alternatively, predetermined) region including the second wavelength ($\lambda_2$). All infrared light in a particular (or, alternatively, predetermined) region including the first wavelength ($\lambda_1$) may be absorbed by the active layer 30 and may not reach the second infrared light sensor 120. In this case, a separate filter for wavelength selectivity with respect to the light entered into the second infrared light sensor 120 is not separately needed and may be omitted from the organic sensor 400.

However, for the time when all infrared light in a particular (or, alternatively, predetermined) region including the first wavelength ($\lambda_1$) is not absorbed by active layer 30, a filter between the first infrared light sensor 100A and the second infrared light sensor 120 may be further disposed.

Accordingly, in the organic sensor 400, the first infrared light sensor 100A may be understood to include a photoelectric device (e.g., photoelectric device 100 and/or 200) configured to sense (e.g., selectively absorb and/or convert (into electrical signals, e.g., photoelectrically convert)) light in a first near-infrared wavelength region of incident light (e.g., a first near-infrared wavelength region including the first wavelength ($\lambda_1$)), and the second infrared light sensor 120 may be understood to be an additional sensor configured to selectively absorb and/or convert (into electrical signals, e.g., photoelectrically convert) light in a separate wavelength region of incident light (e.g., a second near-infrared wavelength region that is different from the first near-infrared wavelength region and includes the second wavelength ($\lambda_2$) and excludes the first wavelength ($\lambda_1$)).

The organic sensor according to some example embodiments may include two infrared light sensors respectively performing separately functions and thus may work as a combination sensor. In addition, two sensors performing separately functions are stacked in each pixel, and thus the number of pixel performing functioning of each sensor is twice increased while maintaining a size and resultantly, sensitivity may be much improved.

As noted above with reference to FIG. 1, the active layer 30, or any portion of the photoelectric device 100 and/or 200, may include the aforementioned compound according to some example embodiments and thus may have improved sensitivity to and/or absorbance of near-infrared light, such that the operational performance and/or efficiency of the organic sensor 400 in absorbing and/or photoelectrically converting incident near-infrared light into electrical signals (e.g., photoelectric conversion performance and/or efficiency) may be improved. In some example embodiments, the second infrared light sensor 120 may include the aforementioned compound according to some example embodiments and thus may have improved sensitivity to and/or absorbance of near-infrared light, such that the operational performance and/or efficiency of the organic sensor 400 in absorbing and/or converting incident near-infrared light into electrical signals (e.g., photoelectric conversion performance and/or efficiency) may be improved. As a result, the functionality of the organic sensor 400 with regard to sensing (e.g., absorbing and/or photoelectrically converting incident light in the near-infrared wavelength region) may be improved based on including the compound in the active layer 30.

Figure 5:
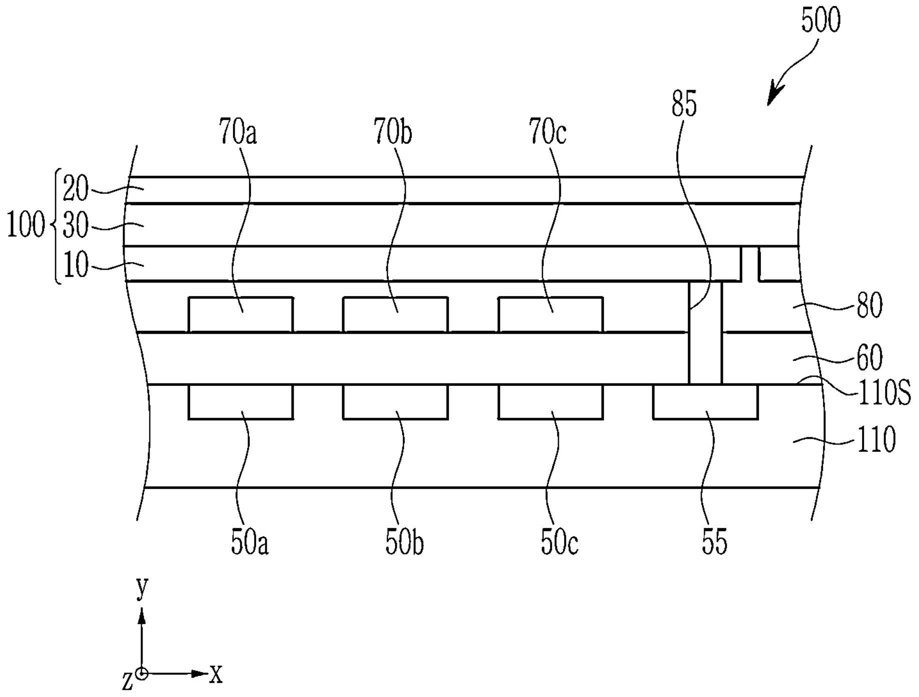
FIG. 5 is a cross-sectional view showing an organic sensor according to some example embodiments.

FIG. 5 is a cross-sectional view showing an example of an organic sensor according to some example embodiments.

An organic sensor according to some example embodiments may be an organic CMOS image sensor.

Referring to FIG. 5, an organic sensor 500 according to some example embodiments includes a semiconductor substrate 110 integrated with photo-sensing devices (e.g., photodiodes, including silicon-based photodiodes) 50*a*, 50*b*, and 50*c*, a transmission transistor (not shown), and a charge storage 55, a lower insulation layer 60, color filters 70*a*, 70*b*, and 70*c*, an upper insulation layer 80, and a photoelectric device 100.

The semiconductor substrate 110 may be integrated with photo-sensing devices 50*a*, 50*b*, and 50*c*, such that the photo-sensing devices 50*a*, 50*b*, and 50*c* are at least partially embedded within the semiconductor substrate 110 and are vertically overlapped by the photoelectric device 100 in the vertical direction that is perpendicular to the top surface 110S, a transmission transistor (not shown), and a charge storage 55. The photo-sensing devices 50*a*, 50*b*, and 50*c* may be photodiodes (e.g., silicon-based photodiodes) that may be configured to sense (e.g., selectively absorb and/or convert (into electric signals, e.g., photoelectrically convert)) light in different visible wavelength regions.

The photo-sensing devices 50*a*, 50*b*, and 50*c*, the transmission transistor, and/or the charge storage 55 may be integrated in each pixel. For example, the blue photo-sensing device 50*a* may be included in a blue pixel, the red photo-sensing device 50*b* may be included in a red pixel, and the green photo-sensing device 50*c* may be included in a green pixel.

The photo-sensing devices 50*a*, 50*b*, and 50*c* sense (e.g., selectively absorb and/or convert (into electrical signals, e.g., photoelectrically convert)) incident light, the information sensed by the photo-sensing devices may be transferred by the transmission transistor, the charge storage 55 is electrically connected to the photoelectric device 100, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing devices 50*a*, 50*b*, and 50*c*.

The lower insulation layer 60 is formed on the metal wire and the pad. The lower insulation layer 60 may include a same or different material composition as the insulation layer 80.

Color filters 70*a*, 70*b*, and 70*c* are formed on the lower insulation layer 60. The color filters 70*a*, 70*b*, and 70*c* includes a blue filter 70*a* formed in a blue pixel, a red filter 70*b* formed in a red pixel, and a green filter 70*c* formed in a green pixel.

The insulation layer (also referred to as upper insulation layer) 80 is formed on the color filters 70*a*, 70*b*, and 70*c*. The insulation layer 80 eliminates steps caused by the color filters 70*a*, 70*b*, and 70*c* and planarizes the surface.

The aforementioned photoelectric device 100 is formed on the insulation layer 80. As described above, the photoelectric device 100 includes a first electrode 10, an active layer 30, and a second electrode 20. Even though a structure in which the first electrode 10, the active layer 30 and the second electrode 20 are sequentially stacked is shown as an example in the drawing, the present inventive concepts are not limited to this structure, and the second electrode 20, the active layer 30, and the first electrode 10 may be arranged in this order.

The first electrode 10 and the second electrode 20 may both be transparent electrodes, and the active layer 30 is the same as described above. The active layer 30 may selectively absorb and/or convert (into electrical signals, e.g., photoelectrically convert) light in a near-infrared wavelength region. As noted above with regard to photoelectric devices 100 and 200, any portion of the photoelectric device 100 (e.g., first electrode 10, second electrode 20, and/or active layer 30) may include the aforementioned compound according to some example embodiments.

Incident light from the side of the second electrode 20 may be photoelectrically converted by mainly absorbing light in a near-infrared wavelength region in the active layer 30. Light in the remaining wavelength region may pass through the first electrode 10 and the color filters 70*a*, 70*b*, and 70*c*, the light in a blue wavelength region passing through the blue filter 70*a* may be sensed by the blue photo-sensing device 50*a*, the light in a red wavelength region passing through the red filter 70*b* may be sensed by the red photo-sensing device 50*b*, and the light in a green wavelength region passing through the green filter 70*c* may be sensed by the green photo-sensing device 50*c*.

As noted above with reference to FIG. 1, the active layer 30 may include the aforementioned compound according to some example embodiments and thus may have improved sensitivity to near-infrared light, such that the operational performance and/or efficiency of the organic sensor 500 in absorbing and/or converting incident near-infrared light into electrical signals (e.g., photoelectric conversion performance and/or efficiency) may be improved. As a result, the functionality of the organic sensor 500 with regard to sensing (e.g., absorbing and/or photoelectrically converting incident light in the near-infrared wavelength region) may be improved based on including the compound in the active layer 30.

Accordingly, where an organic sensor includes a photoelectric device that includes the compound according to some example embodiments and is configured to selectively absorb and/or convert (into electrical signals, e.g., photoelectrically convert) light in a first near-infrared wavelength region, the organic sensor may include an additional sensor that includes a plurality of photodiodes (e.g., photo-sensing devices 50*a*, 50*b*, 50*c*) at least partially embedded within the semiconductor substrate and configured to selectively absorb and/or convert (into electrical signals, e.g., photoelectrically convert) light in separate visible wavelength regions (e.g., red, blue, and/or green light).

Figure 6:
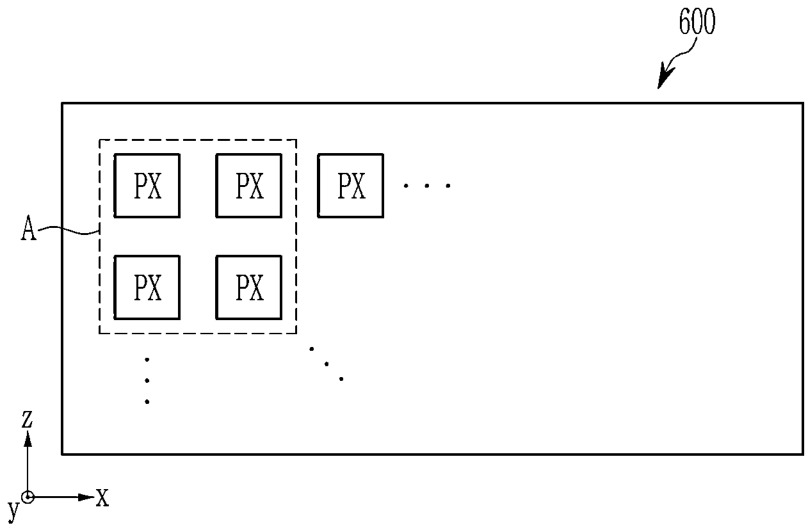
FIG. 6 is a schematic view showing an example of a pixel array of an organic sensor according to some example embodiments.

FIG. 6 is a schematic view showing an example of a pixel array of an organic sensor according to some example embodiments.

Referring to FIG. 6, an organic sensor 600 according to some example embodiments includes a plurality of pixels (PX) and the plurality of pixels (PX) may have a matrix array repeatedly arranged along rows and columns. The plurality of pixels (PX) may form ("at least partially comprise") a unit pixel group (A) of for example a 2×2 array of pixels as shown in FIG. 6. However, an arrangement of the pixels are not limited thereto but variously modified, and the unit pixel group (A) may be variously modified into different arrays of pixels, including a 3×3 array, a 4×4 array, or the like, besides the 2×2 array.

At least a part of the pixels may include a plurality of sensors having different functions inside one pixel, and the plurality of sensors may be stacked therein. In some example embodiments, each pixel (PX) may include two or more organic sensors that are configured to sense (e.g., absorb) light in different wavelength regions ("wavelength spectra of light") in relation to each other, and the organic sensors configured to sense the light in different wavelength regions each other may be stacked in a direction that is perpendicular (e.g., perpendicular within manufacturing tolerances and/or material tolerances) to a top surface of a substrate of the organic sensor 600, as shown in at least FIG. 6 (e.g., a y direction). Herein, the light of the different wavelength regions may be respectively selected from a visible wavelength region; an infrared wavelength region including a near-infrared wavelength region; and an ultraviolet (UV) wavelength region.

It will be understood that any of the organic sensors according to any of the example embodiments herein may have the pixel array structure of organic sensor 600 as shown in FIG. 6.

Figure 7:
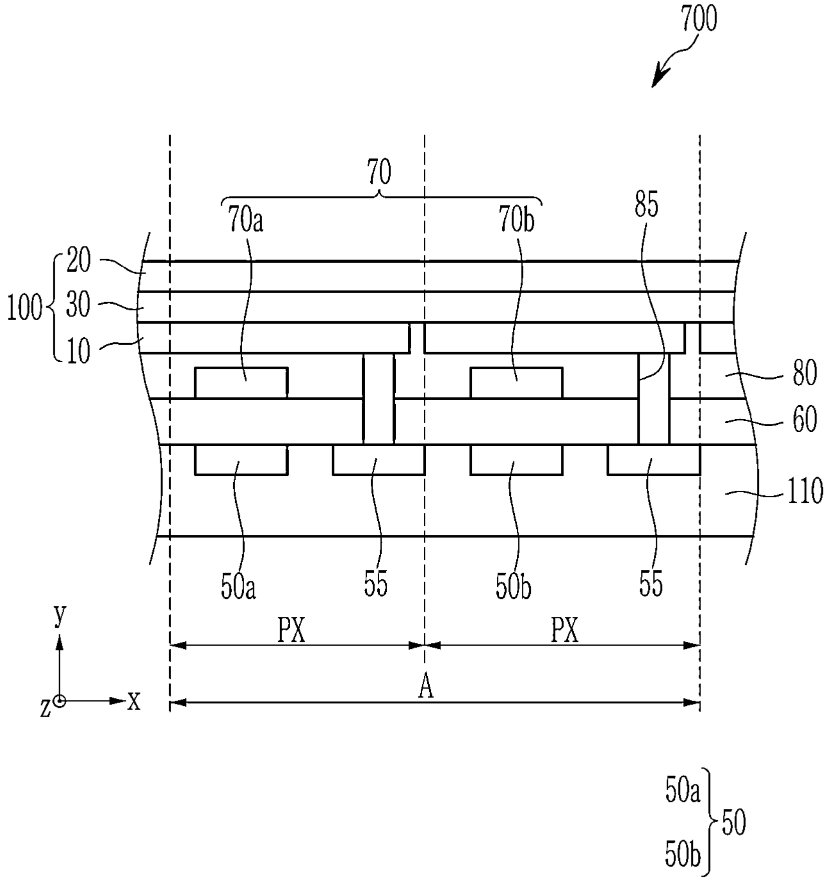
FIG. 7 is a cross-sectional view showing an organic sensor according to some example embodiments.

FIG. 7 is a cross-sectional view showing an organic sensor according to some example embodiments.

Referring to FIG. 7, an organic sensor 700 according to some example embodiments includes a semiconductor substrate 110 integrated with a visible light sensor 50 that includes photo-sensing devices 50*a* and 50*b*, a transmission transistor (not shown), and a charge storage 55; a lower insulation layer 60; a color filter layer 70; an insulation layer 80 (also referred to as an upper insulation layer when present with the lower insulation layer 60 in a same organic sensor); and a photoelectric device 100.

The semiconductor substrate 110 may be a silicon substrate, and is integrated with the photo-sensing devices 50*a* and 50*b*, the transmission transistor (not shown), and the charge storage 55. The photo-sensing devices 50*a* and 50*b* may be photodiodes (e.g., silicon-based photodiodes).

The photo-sensing devices 50*a* and 50*b* may sense light, the information sensed by the photo-sensing devices may be transferred by the transmission transistor, the charge storage 55 is electrically connected to the photoelectric device 100, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but is not limited thereto. However, it is not limited to the structure, and the metal wire and pad may be disposed under the photo-sensing devices 50*a* and 50*b*.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 includes a blue filter 70*a* formed in the blue pixel and a red filter 70*b* formed in the red pixel. In the example embodiments shown in FIG. 7, a green filter is not included, but a green filter may be further included.

The insulation layer 80 is formed on the color filter layer 70. The insulation layer 80 eliminates a step caused by the color filter layer 70 and smoothens the surface. The insulation layer 80 and lower insulation layer 60 may include a contact hole (not shown) exposing a pad, and a through hole (e.g., trench 85) exposing the charge storage 55 of a pixel.

The photoelectric device 100 is formed on the insulation layer 80. The photoelectric device 100 includes a first electrode 10 and a second electrode 20 facing each other and an active layer 30 disposed between the first electrode 10 and the second electrode 20. The photoelectric device 100 may be the same as the photoelectric device 100 of FIG. 1. In some example embodiments, the photoelectric device 100 of FIG. 7 may be replaced with the photoelectric device 200 of FIG. 2.

The first electrode 10 and the second electrode 20 may be all light-transmitting electrodes and the active layer 30 may selectively absorb and/or convert (into electrical signals, e.g., photoelectrically convert) light in a near-infrared wavelength region. In some example embodiments, including the example embodiments shown in FIG. 7, the active layer 30 may additionally selectively absorb and/or convert (into electrical signals, e.g., photoelectrically convert) light in a visible wavelength region (e.g., green light).

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

In FIG. 7, a structure where the photoelectric device 100 selectively absorbing light in a near-infrared wavelength region is stacked on the semiconductor substrate 110 is illustrated, but the present inventive concepts are not limited thereto. Among the light incident on the organic sensor 700 at a top surface of the photoelectric device 100, at least light in a near-infrared wavelength region may be mainly absorbed in the active layer 30 and photoelectrically converted, and light in a visible (e.g., blue, green, and/or red) wavelength region may pass through the first electrode 10 and be sensed by the photo-sensing devices 50*a* and 50*b*.

Figure 8:
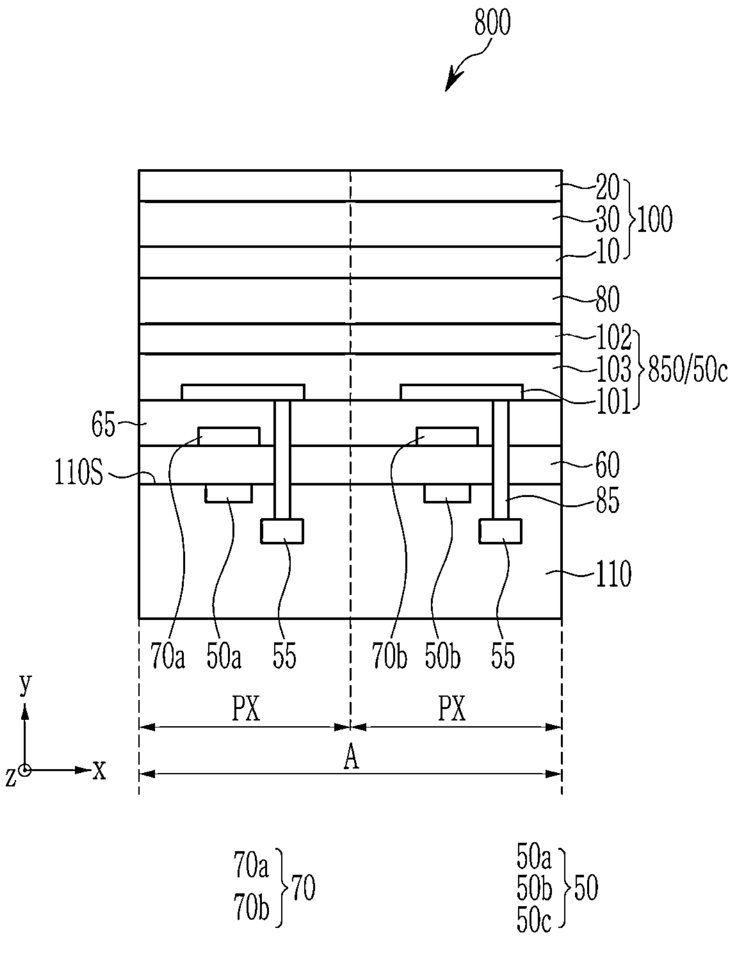
FIG. 8 is a cross-sectional view showing an organic sensor according to some example embodiments.

FIG. 8 is a cross-sectional view showing an organic sensor according to some example embodiments.

Referring to FIG. 8, the organic sensor 800 according to some example embodiments includes a visible light sensor 50, and the photoelectric device 100 as described above.

Referring to FIG. 8, in the organic sensor 800 according to some example embodiments, the visible light sensor 50 may be a combination of a photodiode integrated in the semiconductor substrate 110 and a photoelectric device disposed on the semiconductor substrate 110, and the photoelectric device 100 may be a separate photoelectric device.

Accordingly, where an organic sensor includes a photoelectric device (e.g., 100) that includes the near-infrared absorber and is configured to selectively absorb and/or convert (into electrical signals, e.g., photoelectrically convert) light in a first near-infrared wavelength region, and an additional sensor (e.g., 50*a* and/or 50*b*) configured to selectively absorb and/or convert (into electrical signals, e.g., photoelectrically convert) light in a separate wavelength region of incident light, the organic sensor may further include an additional photoelectric device (e.g., 50*c*) on the semiconductor substrate, the additional photoelectric device being between the photoelectric device 100 and the semiconductor substrate 110, the additional photoelectric device configured to selectively absorb and/or convert (into electrical signals, e.g., photoelectrically convert) light in an additional wavelength region of incident light that is different from the first near-infrared wavelength region and different from the separate wavelength region(s) absorbed by the additional sensor (e.g., 50*a* and/or 50*b*).

In the semiconductor substrate 110, the blue photo-sensing device 50*a*, the red photo-sensing device 50*b*, the charge storage 55, and a transmission transistor (not shown) are integrated. The blue photo-sensing device 50*a* and the red photo-sensing device 50*b* are photodiodes (e.g., silicon-based photodiodes) and spaced apart from each other in a horizontal direction of the semiconductor substrate 110. The blue photo-sensing device 50*a* is integrated in a blue pixel, and the red photo-sensing device 50*b* is integrated in a red pixel.

On the semiconductor substrate 110, the lower insulation layer 60 and the color filter layer 70 are formed. The color filter layer 70 includes a blue filter 70*a* overlapped with the blue photo-sensing device 50*a* and a red filter 70*b* overlapped with the red photo-sensing device 50*b*.

An intermediate insulation layer 65 is formed on the color filter layer 70. The lower insulation layer 60 and the intermediate insulation layer 65 may have a through hole (e.g., trench 85) exposing the charge storage 55. The through hole (e.g., trench 85) may be filled with fillers. At least one of the lower insulation layer 60 or intermediate insulation layer 65 may be omitted.

On the intermediate insulation layer 65, the additional photoelectric device 850 is formed. In the example embodiments shown in FIG. 8, the additional photoelectric device 850 is also green photo-sensing device 50*c*, but it will be understood that in some example embodiments the additional photoelectric device 850 may be configured to sense (e.g., selectively absorb and/or convert (into electrical signals, e.g., photoelectrically convert)) light in a wavelength region that is different from the green wavelength region and may be a non-visible wavelength region (e.g., a second near-infrared wavelength region) that is different from the first near-infrared wavelength region sensed by the photoelectric device 100. The additional photoelectric device 850 includes a first electrode 101 (lower electrode) and a second electrode 102 (upper electrode) facing each other, and an active layer 103 between the first electrode 101 and the second electrode 102. One of the first electrode 101 or the second electrode 102 is an anode and the other is a cathode.

Both of the first electrode 101 and the second electrode 102 may be a light-transmitting electrode, and the light-transmitting electrode may be made of, in some example embodiments, a transparent conductor such as indium tin oxide (ITO) or indium zinc oxide (IZO), or may be a metal thin layer having a thin thickness of several nanometers to several tens of nanometers or a metal thin layer having a thin thickness of several nanometers to several tens of nanometers doped with a metal oxide.

The active layer 103 may have a composition similar to that of the active layer 30 of photoelectric device 100 and/or 200, and may include the compound according to some example embodiments. The active layer 103 may be a photoelectric conversion layer configured to selectively absorb and/or convert (into electrical signals, e.g., photoelectrically convert) light in at least a portion of a wavelength region (e.g., wavelength spectrum of the light). The active layer 103 may for example convert at least a portion of light in a green wavelength region (hereinafter, referred to as "green light"), light in a blue wavelength region (hereinafter, referred to as "blue light"), light in a red wavelength region (hereinafter, referred to as "red light"), light in an infrared wavelength region (hereinafter, referred to as "infrared light"), light in an ultraviolet wavelength region (hereinafter, referred to as "ultraviolet light"), or any combination thereof, or the like, into an electrical signal.

For example, the active layer 103 may be configured to selectively absorb and/or convert (into electrical signals, e.g., photoelectrically convert) at least one of the green light, the blue light, the red light, the infrared light, or the ultraviolet light. Herein, the selective absorption of at least one from the green light, the blue light, the red light, the infrared light, or the ultraviolet light means that a light-absorption spectrum has a peak absorption wavelength (λmax) in one of about 500 nm to about 600 nm, greater than or equal to about 380 nm and less than about 500 nm, greater than about 600 nm and less than or equal to about 700 nm, greater than about 700 nm and less than or equal to about 3000 nm, or less than about 380 nm, and a light-absorption spectrum in the corresponding wavelength region is remarkably higher than those in the other wavelength regions.

The active layer 103 may include at least one p-type semiconductor and at least one n-type semiconductor which form a pn junction and may produce excitons by receiving light from outside and then separate the produced excitons into holes and electrons. The p-type semiconductor and the n-type semiconductor may be independently light-absorbing materials, and for example at least one of the p-type semiconductor or the n-type semiconductor may be an organic light-absorbing material. For example, at least one of the p-type semiconductor or the n-type semiconductor may be a wavelength-selective light-absorbing material that selectively absorbs light in a particular (or, alternatively, predetermined) wavelength region, and for example at least one of the p-type semiconductor or the n-type semiconductor may be a wavelength-selective organic light-absorbing material. The p-type semiconductor and the n-type semiconductor may have a peak absorption wavelength (λmax) in the same wavelength region or in a different wavelength region, among a green wavelength region, a blue wavelength region, a red wavelength region, and an infrared wavelength region. For example, the p-type semiconductor may be an organic material having a core structure including an electron donating moiety, a pi conjugation linking group, and an electron accepting moiety. The p-type semiconductor may be for example represented by Chemical Formula 20, but is not limited thereto.

EDG-HA-EAG [Chemical Formula 20]

In Chemical Formula 20, HA may be a C2 to C30 heterocyclic group having at least one of S, Se, Te, or Si, EDG may be an electron-donating group, and EAG may be an electron accepting group. For example, the p-type semiconductor represented by Chemical Formula 20 may be for example represented by Chemical Formula 20A.

[Chemical Formula 20A]

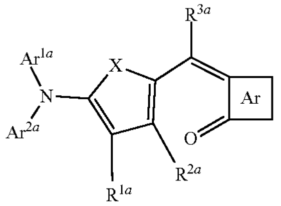

In Chemical Formula 20A, X may be S, Se, Te, SO, $SO_2$, or $SiR^aR^b$, Ar may be a substituted or unsubstituted C6 to C30 arylene group, a substituted or unsubstituted C3 to C30 heterocyclic group, or a fused ring of the foregoing two or more, $Ar^{1a}$ and $Ar^{2a}$ may independently be a substituted or unsubstituted C6 to C30 aryl group or a substituted or unsubstituted C3 to C30 heteroaryl group, $Ar^{1a}$ and $Ar^{2a}$ may independently be present alone or may be linked with each other to form at least one fused ring, and $R^{1a}$ to $R^{3a}$, $R^a$, and $R^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, in Chemical Formula 20A, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group. For example, $Ar^{1a}$ and $Ar^{2a}$ of Chemical Formula 20A may be linked with each other to form a ring or for example, $Ar^{1a}$ and $Ar^{2a}$ may be linked with each other by one of a single bond, $-(CR^gR^h)_{n2}-$ (n2 is 1 or 2), —O—, —S—, —Se—, —N=, $-NR^i-$, $-SiR^jR^k-$, or $-GeR^lR^m-$ to form a ring. Herein, $R^g$ to $R^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the p-type semiconductor represented by Chemical Formula 20 may be for example represented by Chemical Formula 20B.

[Chemical Formula 20B]

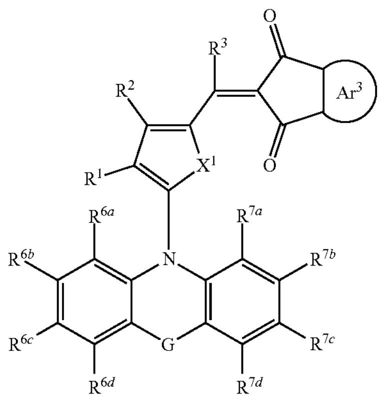

In Chemical Formula 20B, $X^1$ may be Se, Te, O, S, SO, or $SO_2$, $Ar^3$ may be a substituted or unsubstituted C6 to C30 arylene group, a substituted or unsubstituted C3 to C30 heterocyclic group, or a fused ring of the foregoing two or more, $R^1$ to $R^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, or any combination thereof, G may be one of a single bond, —O—, —S—, —Se—, —N=, $-(CR^fR^g)_k-$, $-NR^h-$, $-SiR^iR^j-$, $-GeR^kR^l-$, $-(C(R^m)=C(R^n))-$, or $SnR^oR^p$, wherein $R^f$, $R^g$, $R^h$, $R^i$, $R^j$, $R^k$, $R^l$, $R^m$, $R^n$, $R^o$, and $R^p$ may independently be one of hydrogen, a halogen, a substituted or unsubstituted C1 to C10 alkyl group, a substituted or unsubstituted C1 to C10 alkoxy group, or a substituted or unsubstituted C6 to C12 aryl group, $R^f$ and $R^g$, $R^i$ and $R^j$, $R^k$ and $R^l$, $R^m$ and $R^n$, and $R^o$ and $R^p$ may independently be present alone or may be linked with each other to provide a ring, and k may be 1 or 2, $R^{6a}$ to $R^{6d}$ and $R^{7a}$ to $R^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, or any combination thereof, $R^{6a}$ to $R^{6d}$ may independently be present alone or adjacent two thereof may be linked with each other to form at least one fused ring, and $R^{1a}$ to $R^{7d}$ may independently be present alone or adjacent two thereof may be linked with each other to form at least one fused ring.

For example, $Ar^3$ of Chemical Formula 20B may be a benzene ring, a naphthylene ring, an anthracene ring, a thiophene ring, a selenophene ring, a tellurophene ring, a pyridine ring, a pyrimidine ring, or a fused ring of the foregoing two or more. The n-type semiconductor may be for example fullerene or a fullerene derivative, but is not limited thereto.

The active layer 103 may be an intrinsic layer (an I layer) wherein the p-type semiconductor and the n-type semiconductor are blended as a bulk heterojunction. Herein, the p-type semiconductor and the n-type semiconductor may be blended in a volume ratio of about 1:9 to about 9:1, for example about 2:8 to about 8:2, about 3:7 to about 7:3, about 4:6 to about 6:4, or about 5:5. The active layer 103 may include a bi-layer including a p-type layer including the aforementioned p-type semiconductor and an n-type layer including the aforementioned n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5. The active layer 103 may further include a p-type layer and/or an n-type layer in addition to the intrinsic layer. The p-type layer may include the aforementioned p-type semiconductor (e.g., the aforementioned compound according to some example embodiments) and the n-type layer may include the aforementioned n-type semiconductor. For example, the active layer 103 may include the aforementioned p-type semiconductor and the aforementioned n-type semiconductor in various combinations of p-type layer/I layer, I layer/n-type layer, p-type layer/I layer/n-type layer, and the like.

In the example embodiments shown in FIG. 8, the active layer 103 is configured to selectively absorb and/or convert (into electrical signals, e.g., photoelectrically convert) green light, but example embodiments are not limited thereto, and in some example embodiments the active layer 103 may selectively absorb and/or convert (into electrical signals, e.g., photoelectrically convert) blue light, red light, or any visible wavelength region of light, or any non-visible wavelength region of light (e.g., a second wavelength region of near-infrared light that is selectively transmitted by the photoelectric device 100).

Figure 9:
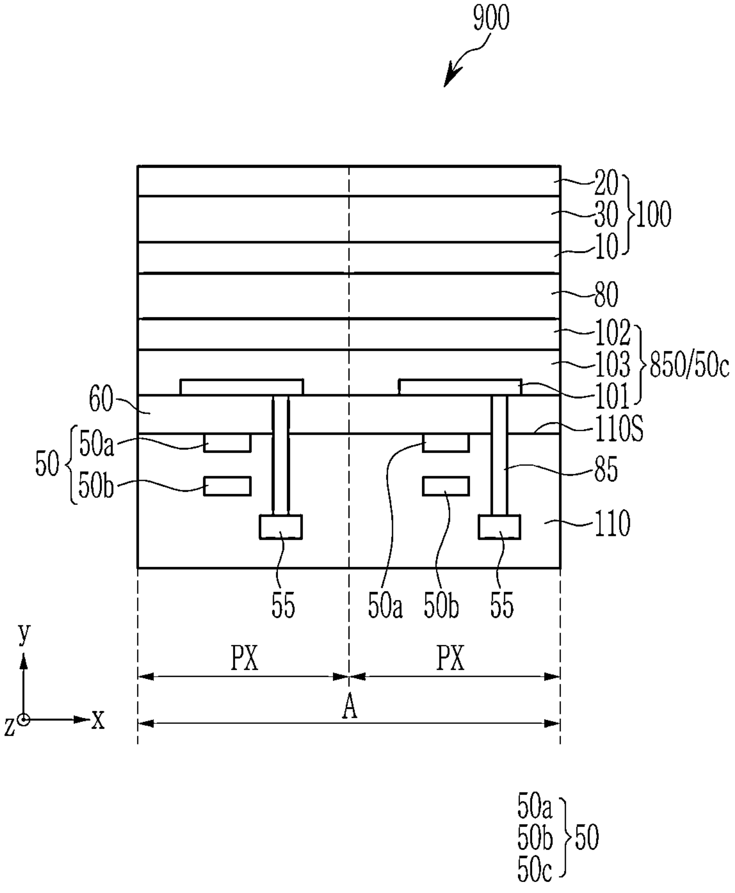
FIG. 9 is a cross-sectional view showing an organic sensor according to some example embodiments.

FIG. 9 is a cross-sectional view showing an organic sensor according to some example embodiments.

Referring to FIG. 9, the organic sensor 900 according to some example embodiments includes the visible light sensor 50, and the photoelectric device 100 like that of some example embodiments. The visible light sensor 50 includes the blue photo-sensing device 50*a* and the red photo-sensing device 50*b* integrated in the semiconductor substrate 110 and an additional photoelectric device 850 that includes a green photo-sensing device 50*c* disposed on the semiconductor substrate 110, wherein the blue photo-sensing device 50*a* and the red photo-sensing device 50*b* may be photodiodes (e.g., silicon-based photodiodes), and the additional photoelectric device 850 may be a green photo-sensing device 50*c* that may be the same as, or different than, the green photo-sensing device 50*c* shown in FIG. 8. The additional photoelectric device 850 includes a first electrode 101, active layer 103, and a second electrode (upper electrode) 102, and the photoelectric device 100 includes a first electrode 10, an active layer 30, and a second electrode 20.

However, in the organic sensor 900 according to some example embodiments, the blue photo-sensing device 50*a* and the red photo-sensing device 50*b* integrated in the semiconductor substrate 110 are stacked in a vertical direction (e.g., perpendicular to the top surface 110S of the semiconductor substrate 110). The blue photo-sensing device 50*a* and the red photo-sensing device 50*b* may be configured to selectively absorb and/or convert (into electrical signals, e.g., photoelectrically convert) light in each wavelength region depending on a stacking depth and thus sense it. In other words, the red photo-sensing device 50*b* configured to selectively absorb and/or convert (into electrical signals, e.g., photoelectrically convert) red light in a long wavelength region is disposed deeper from the surface of the semiconductor substrate 110 than the blue photo-sensing device 50*a* configured to selectively absorb and/or convert (into electrical signals, e.g., photoelectrically convert) blue light in a short wavelength region. In this way, the color filter layer 70 may be omitted by separating absorption wavelengths depending on the stacking depth.

Figure 10:
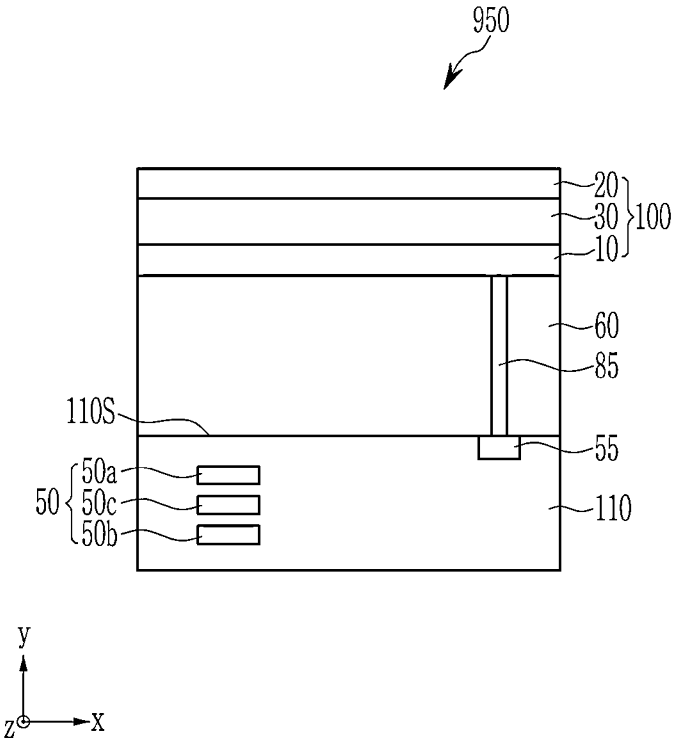
FIG. 10 is a cross-sectional view showing an organic sensor according to some example embodiments.

FIG. 10 is a cross-sectional view showing an organic sensor according to some example embodiments.

Referring to FIG. 10, the organic sensor 950 according to some example embodiments includes the visible light sensor 50, and the photoelectric device 100 like that of some example embodiments. The visible light sensor 50 includes the blue photo-sensing device 50*a*, green photo-sensing device 50*c*, and the red photo-sensing device 50*b* integrated in the semiconductor substrate 110, wherein the blue photo-sensing device 50*a*, the green photo-sensing device 50*c*, and the red photo-sensing device 50*b* may be photodiodes.

In the organic sensor 950 according to some example embodiments, the blue photo-sensing device 50*a*, the green photo-sensing device 50*c*, and the red photo-sensing device 50*b* integrated in the semiconductor substrate 110 are stacked in a vertical direction. The blue photo-sensing device 50*a*, the green photo-sensing device 50*c*, and the red photo-sensing device 50*b* may be configured to selectively absorb and/or convert (into electrical signals, e.g., photoelectrically convert) light in each wavelength region depending on a stacking depth from the top surface 110S and thus sense it. In other words, the red photo-sensing device 50*b* configured to selectively absorb and/or convert (into electrical signals, e.g., photoelectrically convert) red light in a long wavelength region is disposed deeper from the top surface 110S of the semiconductor substrate 110 than the blue photo-sensing device 50*a* configured to selectively absorb and/or convert (into electrical signals, e.g., photoelectrically convert) blue light in a short wavelength region, and the green photo-sensing device 50*c* configured to selectively absorb and/or convert (into electrical signals, e.g., photoelectrically convert) green light in a medium wavelength region is disposed deeper from the top surface 110S of the semiconductor substrate 110 than the blue photo-sensing device 50*a* and closer to the top surface 110S of the semiconductor substrate 110 than the red photo-sensing device 50*b*. In this way, the color filter layer 70 may be omitted by separating absorption wavelengths depending on the stacking depth.

Figure 11:
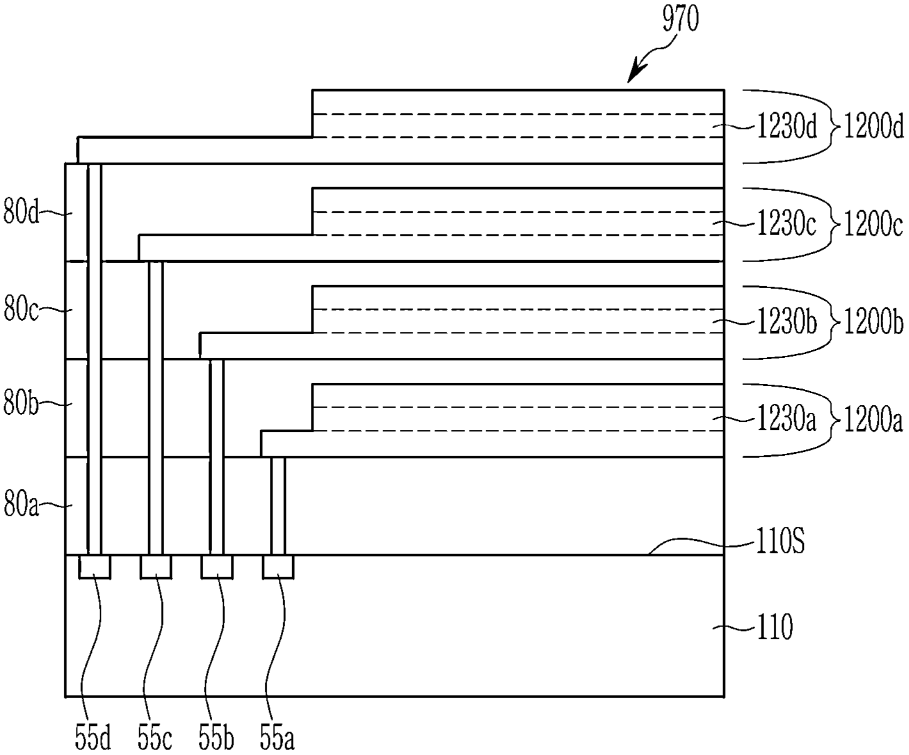
FIG. 11 is a cross-sectional view showing an organic sensor according to some example embodiments.

FIG. 11 is a cross-sectional view showing an organic sensor according to some example embodiments.

Referring to FIG. 11, the organic sensor 970 according to some example embodiments includes a first photoelectric device (e.g., the fourth photoelectric device 1200*d*, which may be an infrared/near-infrared photoelectric device) configured to selectively absorb and/or convert (into electrical signals, e.g., photoelectrically convert) light in an infrared/near-infrared wavelength spectrum of incident light (e.g., a first near-infrared wavelength region), and at least one additional photoelectric device (e.g., 1200*a*-1200*c*) vertically stacked between the first photoelectric device and a semiconductor substrate (e.g., 110), each separate photoelectric device of the at least one additional photoelectric device including a separate photoelectric conversion layer and configured to selectively absorb and/or convert (into electrical signals, e.g., photoelectrically convert) light in a separate (e.g., respective) wavelength region of incident light that is different from the first near-infrared wavelength region and which may be a separate visible and/or non-visible wavelength region. For example, as shown in FIG. 11, the organic sensor 970 may include additional photoelectric devices that include a red photoelectric device configured to selectively absorb and/or convert (into electrical signals, e.g., photoelectrically convert) light in a red wavelength spectrum of incident light, a green photoelectric device configured to selectively absorb and/or convert (into electrical signals) light in a green wavelength spectrum of incident light, and a blue photoelectric device configured to selectively absorb and/or convert (into electrical signals) light in a blue wavelength spectrum of incident light, and they are stacked in the vertical direction (e.g., a direction extending perpendicular to a top surface 110S of the semiconductor substrate 110).

Accordingly, it will be understood that, as shown in FIG. 11, the organic sensor 970 may include a plurality of photoelectric devices 1200*a*-1200*d* that are stacked vertically on the semiconductor substrate 110, such that the plurality of photoelectric devices 1200*a* to 1200*d* overlap each other in a direction extending perpendicular to a top surface 110S of the semiconductor substrate 110. While the organic sensor 970 includes multiple additional photoelectric devices 1200*a*-1200*c* in addition to the first photoelectric device (e.g., fourth photoelectric device 1200*d*) configured to selectively absorb and/or convert light in the first near-infrared wavelength region, it will be understood that in some example embodiments the organic sensor 970 may be limited to a single additional photoelectric device (e.g., any of 1200*a* to 1200*c*) between the fourth photoelectric device 1200*d* and the semiconductor substrate 110.

The organic sensor 970 according to some example embodiments includes a semiconductor substrate 110, a lower insulation layer 80*a*, an intermediate insulation layer 80*b*, another intermediate insulation layer 80*c*, an upper insulation layer 80*d*, a first photoelectric device 1200*a*, a second photoelectric device 1200*b*, a third photoelectric device 1200*c*, and a fourth photoelectric device 1200*d*. In some example embodiments, the fourth photoelectric device 1200*d* may be referred to as a first photoelectric device configured to selectively absorb and/or convert (into electrical signals, e.g., photoelectrically convert) light in a first near-infrared wavelength region, and the first to third photoelectric devices 1200*a* to 1200*c* may be collectively referred to as at least one additional photoelectric device configured to selectively absorb and/or convert (into electrical signals, e.g., photoelectrically convert) light in one or more separate wavelength regions different from the first near-infrared wavelength region. As shown, the first to fourth photoelectric devices 1200*a* to 1200*d* are stacked vertically on the semiconductor substrate 110, such that the first to fourth photoelectric devices 1200*a* to 1200*d* overlap each other in a direction extending perpendicular to a top surface 110S of the semiconductor substrate 110.

The semiconductor substrate 110 may be a silicon substrate, and is integrated with the transmission transistor (not shown) and charge storages.

The first through third photoelectric devices 1200*a*-1200*c* may have a same structure as the additional photoelectric devices 850 shown in FIGS. 8 and 9, except each separate photoelectric device 1200*a*-1200*c* may be configured to photoelectrically convert a separate wavelength region of visible and/or non-visible (e.g., near-infrared) light, and the photoelectric conversion layers 1230*a*-1230*c* may have the same structure and/or composition as various example embodiments (e.g., different example embodiments) of the active layer 103 and/or active layer 30 as described herein so as to be configured to selectively absorb and/or convert (into electrical signals, e.g., photoelectrically convert) different visible and/or non-visible wavelength regions of light, and may include the near-infrared absorber. The fourth photoelectric device 1200*d* may have a same structure as photoelectric device 100 of FIG. 1 and/or photoelectric device 200 of FIG. 2, and the photoelectric conversion layer 1230*d* may have a same structure and/or composition as the active layer 30 as described herein, and may include the aforementioned compound according to some example embodiments.

The first photoelectric device 1200*a* is formed on the lower insulation layer 80*a*. The first photoelectric device 1200*a* includes a photoelectric conversion layer 1230*a*. The first photoelectric device 1200*a* may be any one of the photoelectric devices described herein according to any of the example embodiments. The photoelectric conversion layer 1230*a* may selectively absorb and/or convert (into electrical signals, e.g., photoelectrically convert) light in one of infrared, red, blue, or green wavelength spectra of incident light. For example, the first photoelectric device 1200*a* may be a blue photoelectric device.

An intermediate insulation layer 80*b* is formed on the first photoelectric device 1200*a*.

The second photoelectric device 1200*b* is formed on the intermediate insulation layer 80*b*. The second photoelectric device 1200*b* includes a photoelectric conversion layer 1230*b*. The second photoelectric device 1200*b* may be any one of the photoelectric devices described herein according to any of the example embodiments. The photoelectric conversion layer 1230*b* may selectively absorb and/or convert (into electrical signals, e.g., photoelectrically convert) light in one of infrared, red, blue, or green wavelength spectra of incident light. For example, the second photoelectric device 1200*b* may be a green photoelectric device.

Another intermediate insulation layer 80*c* is formed on the second photoelectric device 1200*b*.

The third photoelectric device 1200*c* is formed on the intermediate insulation layer 80*c*. The third photoelectric device 1200*c* includes a photoelectric conversion layer 1230*c*. The third photoelectric device 1200*c* may be any one of the photoelectric devices described herein according to any of the example embodiments. The photoelectric conversion layer 1230*c* may selectively absorb and/or convert (into electrical signals, e.g., photoelectrically convert) light in one of infrared, red, blue, or green wavelength spectra of incident light. For example, the third photoelectric device 1200*c* may be a red photoelectric device.

The upper insulation layer 80*d* is formed on the third photoelectric device 1200*c*.

The lower insulation layer 80*a*, the intermediate insulation layers 80*b* and 80*c*, and the upper insulation layer 80*d* have a plurality of through holes exposing the charge storages 55*a*, 55*b*, 55*c*, and 55*d*.

The fourth photoelectric device 1200*d* is formed on the upper insulation layer 80*d*. The fourth photoelectric device 1200*d* includes a photoelectric conversion layer 1230*d*. The fourth photoelectric device 1200*d* may be any one of the photoelectric devices described herein according to any of the example embodiments. The photoelectric conversion layer 1230*d* may selectively absorb and/or convert (into electrical signals, e.g., photoelectrically convert) light in one of infrared, red, blue, or green wavelength spectra of light. For example, the fourth photoelectric device 1200*d* may be an infrared/near-infrared photoelectric device that may include the near-infrared absorber.

In the drawing, the first photoelectric device 1200*a*, the second photoelectric device 1200*b*, the third photoelectric device 1200*c*, and the fourth photoelectric device 1200*d* are sequentially stacked, but the present inventive concepts are not limited thereto, and they may be stacked in various orders.

As described above, the first photoelectric device 1200*a*, the second photoelectric device 1200*b*, the third photoelectric device 1200*c*, and the fourth photoelectric device 1200*d* have a stack structure, and thus the size of an organic sensor may be reduced to realize a down-sized organic sensor.

The organic sensor may be applied to various electronic devices, for example and the electronic devices may include for example a camera, a camcorder, a mobile phone internally having them, a display device, a security device, or a medical device, but are not limited thereto.

Figure 12:
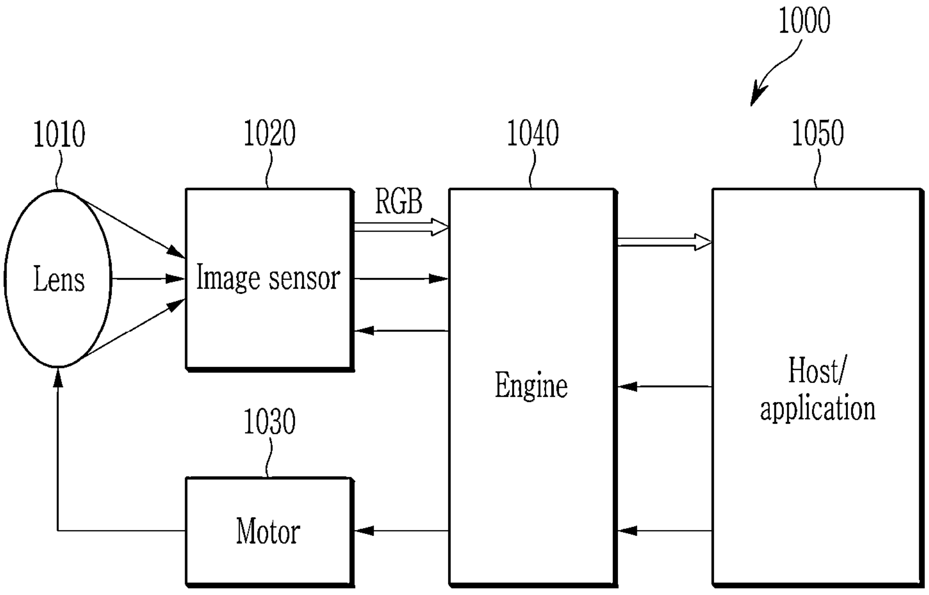
FIG. 12 is a block diagram of a digital camera including an organic sensor according to some example embodiments.

FIG. 12 is a block diagram of a digital camera including an image sensor according to some example embodiments.

Referring to FIG. 12, a digital camera 1000 includes a lens 1010, an image sensor 1020, a motor 1030, and an engine 1040. The image sensor 1020 may be one of image sensors according to some example embodiments, including the example embodiments shown in FIGS. 3 to 11.

The lens 1010 concentrates incident light on the image sensor 1020. The image sensor 1020 generates RGB data for received light through the lens 1010.

In some example embodiments, the image sensor 1020 may interface with the engine 1040.

The motor 1030 may adjust the focus of the lens 1010 or perform shuttering in response to a control signal received from the engine 1040. The engine 1040 may control the image sensor 1020 and the motor 1030.

The engine 1040 may be connected to a host/application 1050.

Figure 13:
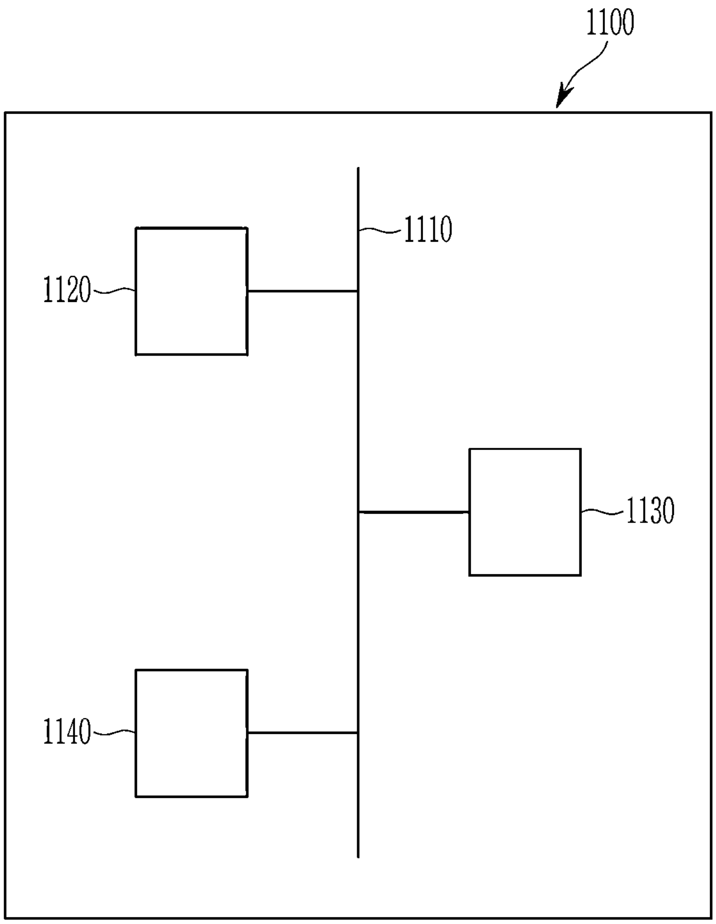
FIG. 13 is a schematic diagram showing an electronic device according to some example embodiments.

FIG. 13 is a schematic diagram showing an electronic device 1100 according to some example embodiments. Referring to FIG. 13, an electronic device 1100 may include a processor 1120, a memory 1130, and an image sensor 1140 that are electrically coupled together via a bus 1110. The image sensor 1140 may be an image sensor and/or organic sensor according to one of any of the example embodiments of image sensors and/or organic sensors. The memory 1130 may be a non-transitory computer readable medium and may store a program of instructions. The memory 1130 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1120 may execute the stored program of instructions to perform one or more functions. For example, the processor 1120 may be configured to process electrical signals generated by the image sensor 1140. The processor 1120 may include processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1120 may be configured to generate an output (e.g., an image to be displayed on a display interface) based on such processing.

As described herein, any devices, systems, modules, portions, units, controllers, circuits, and/or portions thereof according to any of the example embodiments, and/or any portions thereof (including, without limitation, the digital camera 1000, the image sensor 1020, the motor 1030, the engine 1040, the host/application 1050, the electronic device 1100, the processor 1120, the memory 1130, the image sensor 1140, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, portions, units, controllers, circuits, and/or portions thereof according to any of the example embodiments.

Hereinafter, some example embodiments are illustrated in more detail with reference to examples. However, the example embodiments are not limited to these examples.

SYNTHESIS EXAMPLES

Synthesis Example 1: Synthesis of Compound Represented by Chemical Formula A-1

[Chemcial Formula A-1]

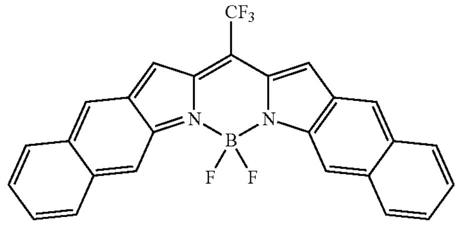

[Reaction Scheme A-1]

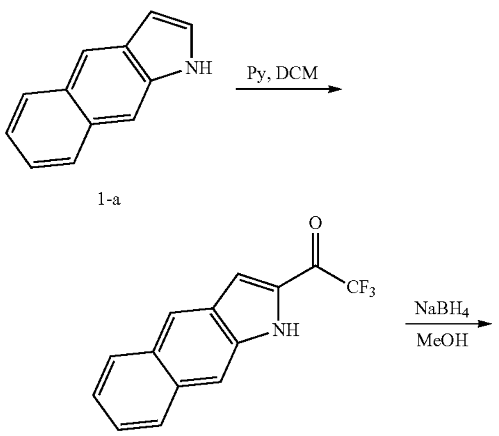

1-a 1-b

-continued

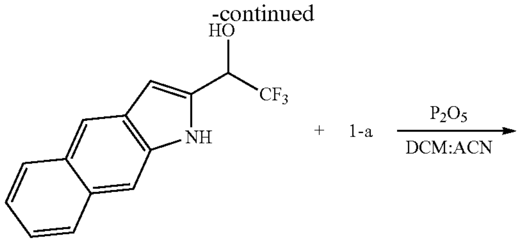

1-c

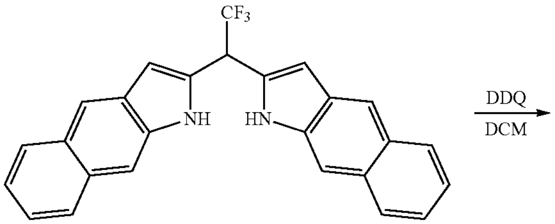

1-d

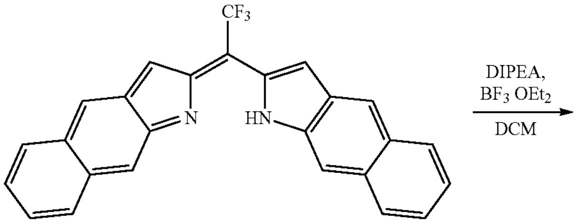

1-e

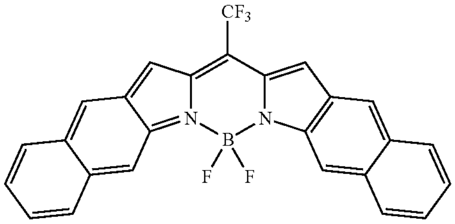

Chemical Formula A-1

Synthesis of Compound 1-b

The compound 1-a (1H-benzo[f]indole) in Reaction Scheme A-1 is commercially available from Tokyo Chemical Industry Company Limited.

The solution of trifluoroacetic anhydride (60 mmol) in dried dichloromethane (DCM) (100 mL) was added dropwise to the mixture of the compound 1-a (1H-benzo[f] indole) (50 mmol) and pyridine (Py) (60 mmol) in dried dichloromethane (500 mL) under stirring for 30 min. Then the reaction mixture was stirred for 2 hours (h) and diluted with saturated solution of $Na_2CO_3$. Organic layer was separated; water layer was extracted with ehylacetate (3×100 mL). Combined ethylacetate layers were washed with water (3×100 mL) and dried over $K_2CO_3$. After removing solvent, the residue was washed by cold ethanol to give compound 1-b (please refer to Org. Lett. 2011, 13, pp. 2524-2527).

Synthesis of Compound 1-c

To the mixture of compound 1-b (50 mmol) and 2.1 equiv. of $NaHCO_3$ (105 mmol) in MeOH (150 mL) under intensive stirring 2 equiv. of $NaBH_4$ (100 mmol) was added by portions during 10 min and the reaction mixture was stirred for 30 min. The residue after removing of MeOH was diluted with water (30 mL), extracted with ethylacetate (4×100 mL) and dried over $Na_2SO_4$. The ethylacetate was removed and the resulting residue was purified by flash chromatography (silicagel) to give the products 1-c (please refer to Org. Lett. 2011, 13, pp. 2524-2527).

Synthesis of Compound 1-d

Figure 14:
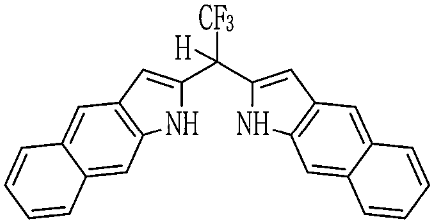
FIG. 14 is an NMR-graph of intermediate compound 1-d of the compound according to Synthesis Example 1 according to some example embodiments.
Figure 14:
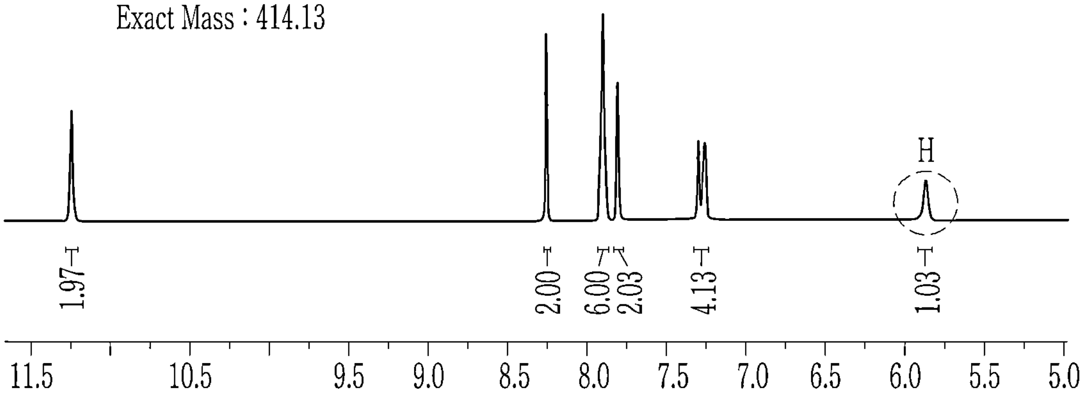

The mixture of 1-a (5 mmol) and 1-c (5 mmol) in mixture solution of dried dichloromethane and acetonitrile (ACN) (60 mL, 1:1 vol/vol) was added to $P_2O_5$ (5 mmol) under argon and stirred at room temperature for 2 days. Then $NaHCO_3$ (6.3 mmol) was added and the mixture was stirred at room temperature for 1 h. The precipitate was filtered off and washed with $CH_2Cl_2$ (3×50 mL). The compound 1-d was isolated by column chromatography ($SiO_2$, hexane/dichloromethane 1:1). FIG. 14 shows an NMR graph of compound 1-d.

Synthesis of Compound 1-e

Figure 15:
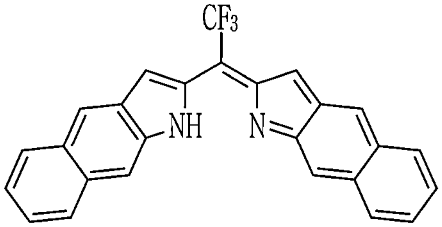
FIG. 15 is an NMR-graph of intermediate compound 1-e of the compound according to Synthesis Example 1 according to some example embodiments.
Figure 15:
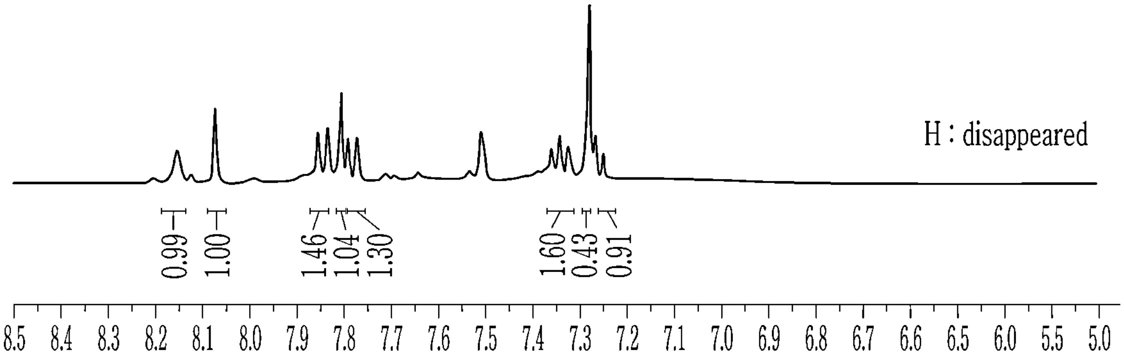

The compound 1-d (95 mg, 0.23 mmol) was dissolved in $CH_2Cl_2$ (10 mL), and 2,3-Dichloro-5,6-dicyano-p-benzoquinone (DDQ) (54.8 mg, 0.23 mmol) was added in portion to the solution. After stirring 2 hours at room temperature, water was added and was extracted with $CH_2Cl_2$. After drying over $Na_2SO_4$, the solvent was concentrated by reduced pressure. Then, the residue was briefly purified with silica gel filter, the solvent was concentrated by reduced pressure, and residual solvent was removed by vacuum to obtain compound 1-e. FIG. 15 shows an NMR graph of compound 1-e.

Synthesis of Compound Represented by Chemical Formula A-1

Figure 16:
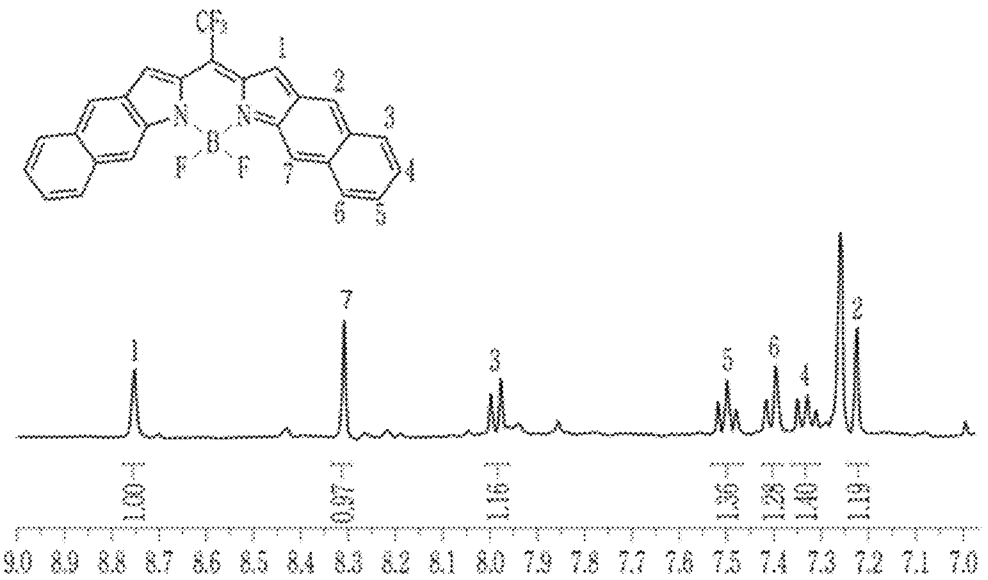
FIG. 16 is an NMR-graph of compound A-1 according to Synthesis Example 1 according to some example embodiments.

The compound 1-e was diluted with $CH_2Cl_2$ (10 mL), and di-iso-propyl ethylamine (DIPEA) (0.38 mL; 2.5 mmol) was added dropwise in an ice bath. After 15 minutes, boron trifluoro diethyl ether; $BF_3{\cdot}OEt_2$) (0.42 mL; 3.38 mmol) was added dropwise. After 5 minutes, the reaction solution was heated to room temperature, and reacted overnight. After concentrating by reduced pressure, small amounts of hexane and toluene were added for slurrification to obtain dark red solid (19 mg). High Resolution Mass Spectroscopy (HRMS; APCI) was calculated for $C_{26}H_{14}BF_5N_2$ [M+H]+461.12, and confirmed the compound represented by Chemical Formula A-1 having molecular weight of 461.23. FIG. 16 shows an NMR graph of the compound represented by Chemical Formula A-1.

Synthesis Example 2: Synthesis of Compound Represented by Chemical Formula A-2

[Chemical Formula A-2]

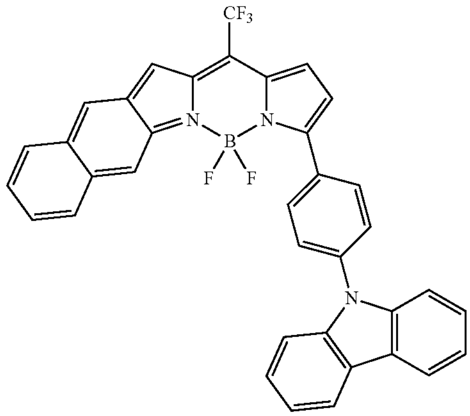

[Reaction Scheme A-2]

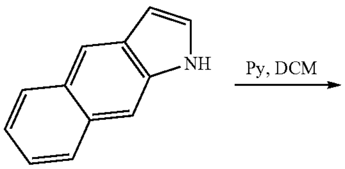

1-a

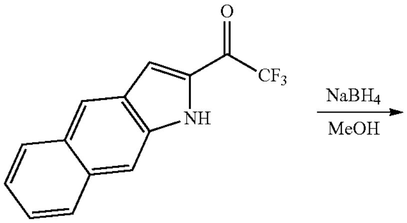

1-b

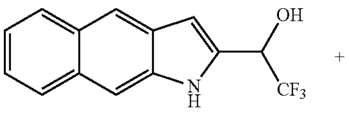

1-c

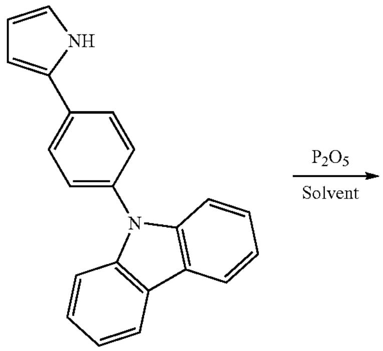

2-a

-continued

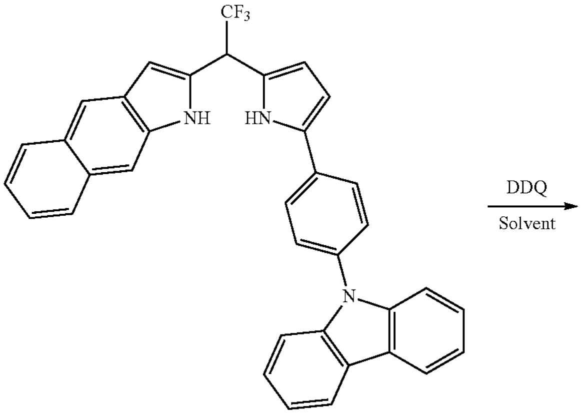

2-b

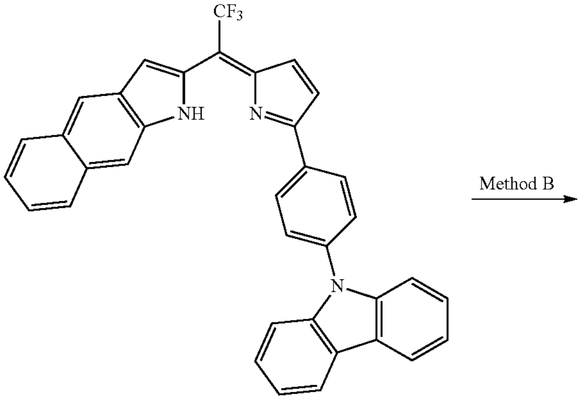

2-c

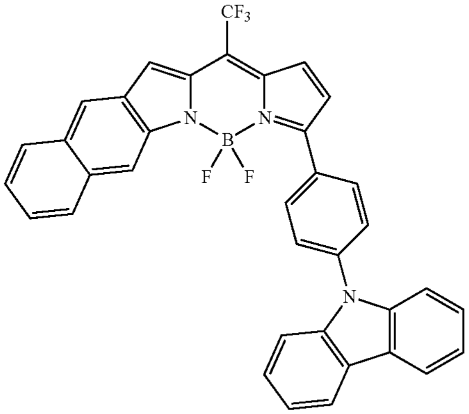

Chemical Formula A-2

Preparation of Compounds 1-a to 1-c

The compounds 1-a to 1-c in Reaction Scheme A-2 are the same as those described in Reaction Scheme A-1, and thus the compounds were prepared in the same manner as described in Synthesis Example 1.

Synthesis of Compound 2-a

At room temperature and under an inert atmosphere, $Pd(PPh_3)_4$ (0.08 equiv.), boronic acid (1.1 equiv.), and a 0.3 M solution of $K_2CO_3$ (3 equiv.) in $H_2O$ were added to a 0.1 M solution of 9-(4-bromophenyl)-9H-carbazole in anhydrous 1,4-dioxane. This solution was stirred at 100° C. for 12 hours. After cooling to room temperature, the solution was filtered through celite and solvents were removed under reduced pressure. A solution of crude product in THF (3.5 mL) was stirred under argon and treated with NaOMe (1.5 equiv.). After 90 min at room temperature, the resulting mixture was then cautiously quenched at 0° C. with $H_2O$ and a saturated aqueous $NH_4Cl$ solution was added. The solution was diluted with $CH_2Cl_2$, washed with $H_2O$, dried with $MgSO_4$, filtered and concentrated. The product was purified by column chromatography on silica gel ($CH_2Cl_2$) to afford compound 2-a (please refer to ACS Omega 2022, 7, 20, 17083-17097).

Synthesis of Compound 2-b

The mixture of compound 1-c (5 mmol) and compound 2-a (5 mmol) in mixture solution of dried dichloromethane and acetonitrile (60 mL, 1:1 vol/vol) was added to $P_2O_5$ (5 mmol) under argon and stirred at room temperature for 2 days. Then $NaHCO_3$ (6.3 mmol) was added and the mixture was stirred at room temperature for 1 hour. The precipitate was filtered off and washed with $CH_2Cl_2$ (3×50 mL). The compound 2-b was isolated by column chromatography ($SiO_2$, hexane/dichloromethane 1:1) (please refer to Org. Lett. 2011, 13, pp. 2524-2527).

Synthesis of Compound 2-c

The mixture of 2-b (1 mmol) and DDQ (1 mmol) in dried dichloromethane (10 mL) was stirred at room temperature for 1 hour, then the solvent was removed under vacuum and the obtained residue was purified by column chromatography ($SiO_2$, hexane/dichloromethane, 1:1) to yield the compound 2-c (please refer to Org. Lett. 2011, 13, pp. 2524-2527).

Synthesis of Compound Represented by Chemical Formula A-2

The same method for preparing the compound represented by Chemical Formula A-1 from the compound 1-e in Reaction Scheme A-1 of Synthesis Example 1 was used to prepare the compound represented by Chemical Formula A-2 from the compound 2-c. That is, after diluting the compound 2-c with $CH_2Cl_2$ (10 mL), di-iso-propyl ethylamine (0.38 mL; 2.5 mmol) was added dropwise in an ice bath. After 15 minutes, boron trifluoro diethyl ether; $BF_3{\cdot}OEt_2$) (0.42 mL; 3.38 mmol) was added dropwise. After 5 minutes, the reaction solution was heated to room temperature, and reacted overnight. After concentrating by reduced pressure, small amounts of hexane and toluene were added for slurrification to obtain the compound represented by Chemical Formula A-2.

Synthesis Example 3: Synthesis of Compound Represented by Chemical Formula A-3

[Chemical Formula A-3]

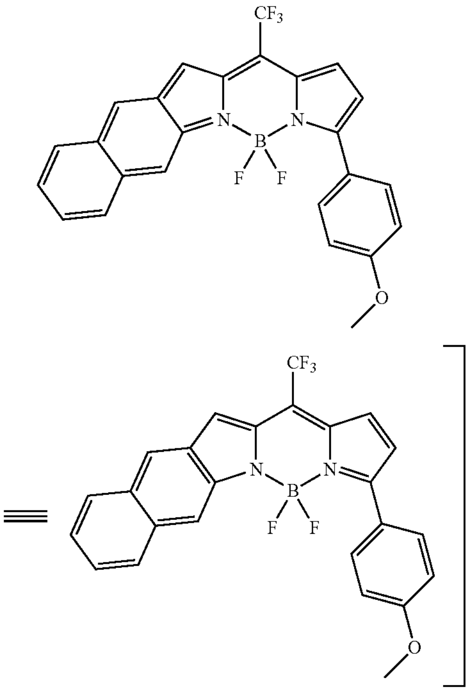

[Reaction Scheme A-3]

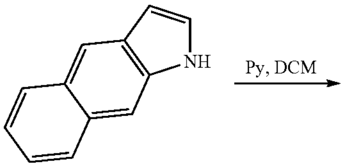

1-a

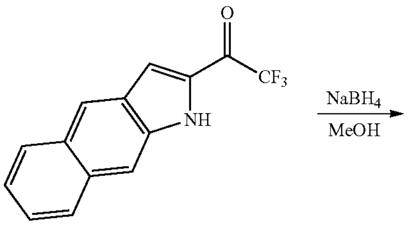

1-b

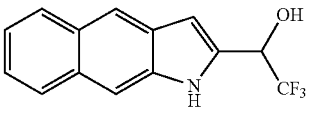

\+

1-c

-continued

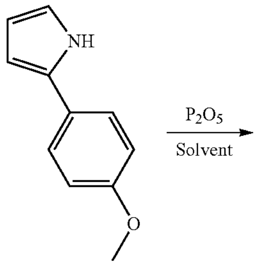

3-a

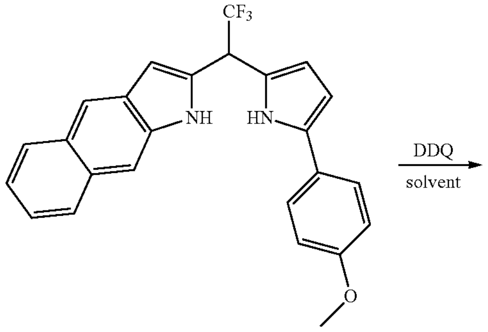

3-b

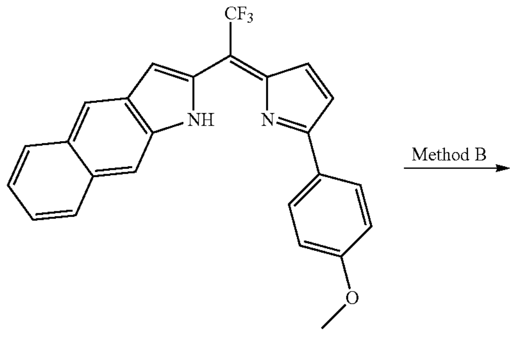

3-c

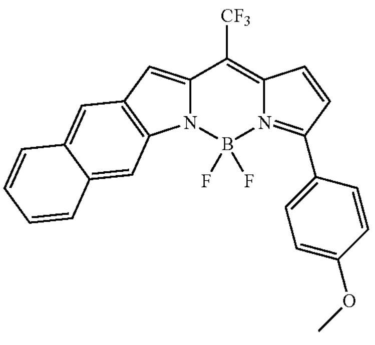

Chemical Formula A-3

Synthesis of Compound Represented by Chemical Formula A-3

The compound represented by Chemical Formula A-3 was prepared as described in Reaction Scheme A-3, which is similar to Reaction Scheme A-2, except that the compound 3-a, instead of the compound 2-a in Reaction Scheme A-2, was reacted with the compound 1-c.

Synthesis Example 4: Synthesis of Compound Represented by Chemical Formula A-4

Chemical Formula A-4

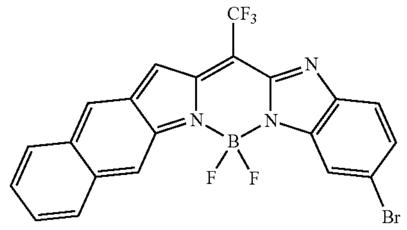

[Reaction Scheme A-4]

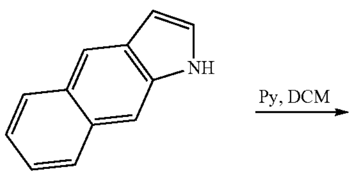

1-a

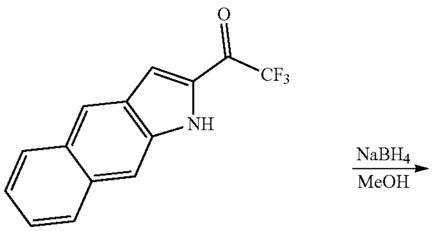

1-b

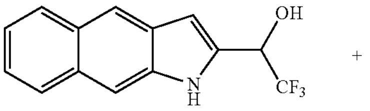

1-c

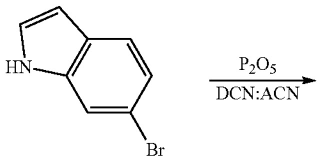

4-a

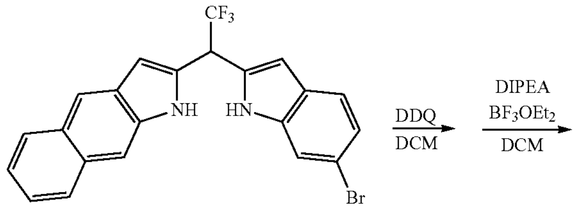

4-b

-continued

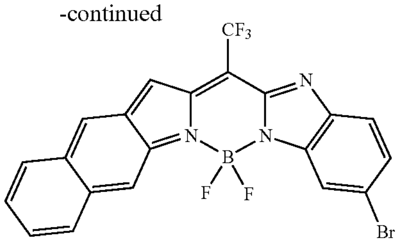

Chemical Formula A-4

Preparation of Compounds 1-a to 1-c, and Compound 4-a

The compounds 1-a to 1-c in Reaction Scheme A-4 are the same as those described in Reaction Scheme A-1, and thus the compounds were prepared in the same manner as described in Synthesis Example 1.

The compound 4-a in Reaction Scheme A-4 is commercially available from Tokyo Chemical Industry Company Limited.

Synthesis of Compound 4-b

Figure 17:
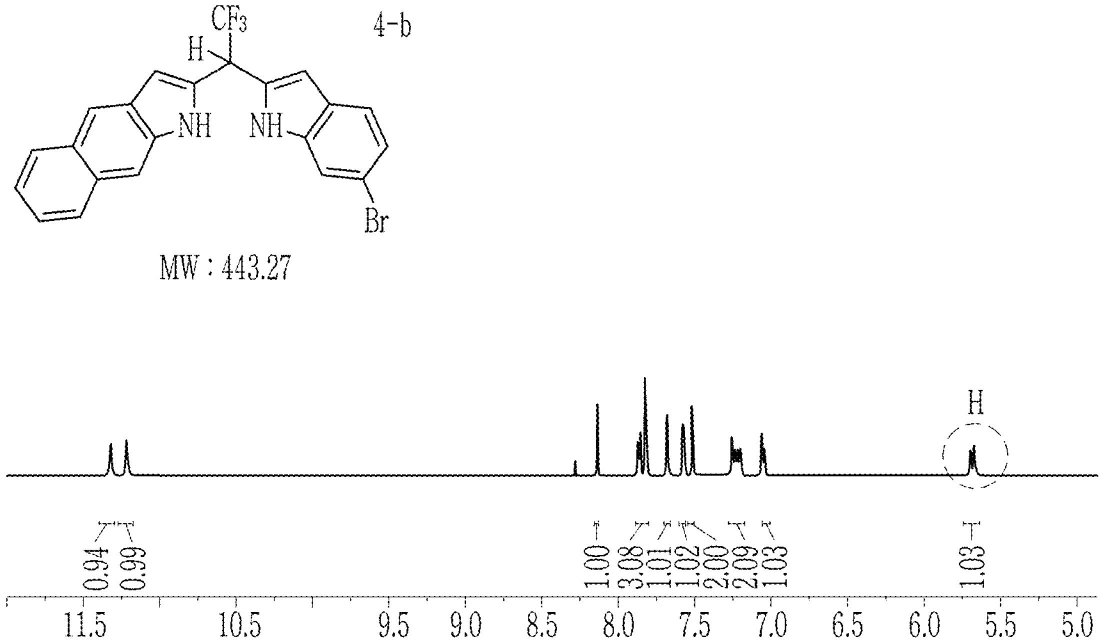
FIG. 17 is an NMR-graph of intermediate compound 4-b of the compound according to Synthesis Example 4 according to some example embodiments.

The mixture of compound 1-c (5 mmol) and compound 4-a (5 mmol) in mixture solution of dried dichloromethane and acetonitrile (60 mL, 1:1 vol/vol) was added to $P_2O_5$ (5 mmol) under argon and stirred at room temperature for 2 days. Then $NaHCO_3$ (6.3 mmol) was added and the mixture was stirred at room temperature for 1 hour. The precipitate was filtered off and washed with $CH_2Cl_2$ (3×50 mL). The compound 4-b was isolated by column chromatography ($SiO_2$, hexane/dichloromethane 1:1) (please refer to Org. Lett. 2011, 13, pp. 2524-2527). FIG. 17 shows an NMR graph of the compound 4-b.

Synthesis of Compound Represented by Chemical Formula A-4

Figure 18:
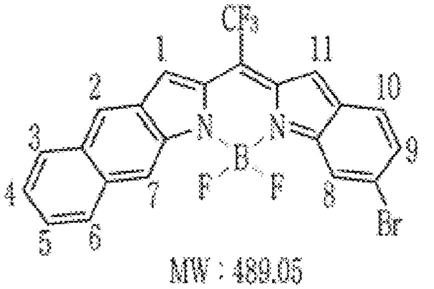
FIG. 18 is an NMR-graph of compound represented by Chemical Formula A-4 according to Synthesis Example 4 according to some example embodiments.
Figure 18:
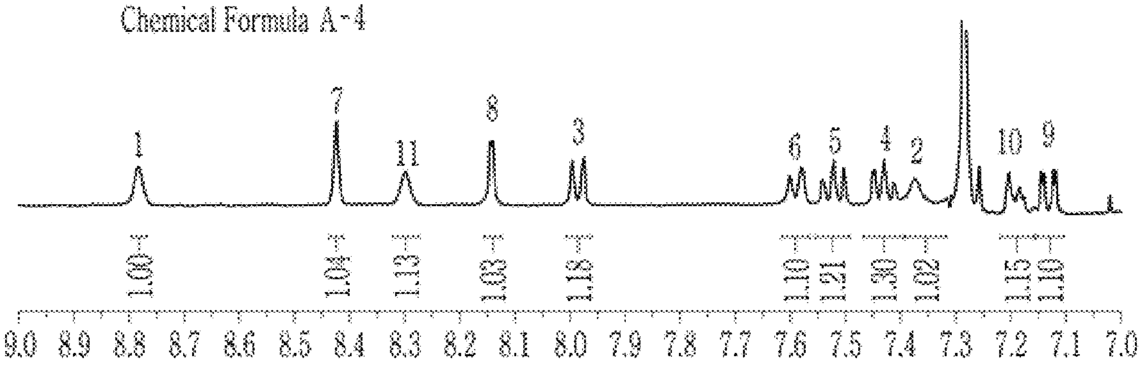

The compound 4-b (100 mg; about 0.23 mmol) was dissolved in dried dichloromethane (10 mL), and DDQ (54.8 mg; 0.23 mmol) was added in portion thereto. After stirring at room temperature for 2 hours, water was added, and then extracted with DCM. Then, the extracts were treated with $Na_2SO_4$, and the solvents were concentrated by reduced pressure. After removing residual solvent by vacuum, next reaction was performed in-situ. That is, the residue was diluted with DCM (10 mL), and di-iso-propyl ethylamine (0.38 mL; 2.5 mmol) was added dropwise in an ice bath. After 15 minutes, boron trifluoro diethyl ether ($BF_3 \cdot OEt_2$) (0.42 mL; 3.38 mmol) was added dropwise. After 5 minutes, the reaction solution was heated to room temperature, and reacted overnight. After concentrating by reduced pressure, small amounts of hexane and toluene were added for slurrification to obtain solid. High Resolution Mass Spectroscopy (HRMS; APCI) was calculated for $C_{22}H_{11}BBrF_5N_2$ [M+H]+489.01, and confirmed the compound represented by Chemical Formula A-4 having molecular weight of 489.05. FIG. 18 shows an NMR graph of the compound represented by Chemical Formula A-4.

Evaluation I: Light Absorption Characteristics

In order to predict light absorption characteristics and electronic structures of the following compounds A-5, A-6, and A-7 according to some example embodiments based on DFT (Discrete Fourier Transform), simulations were performed in various combinations of the exchange-correlation functionals that represent electron exchange and correlation effects and the basis sets that approximate electronic wave functions, and the results are described in Table 1.

[Compound A-5]

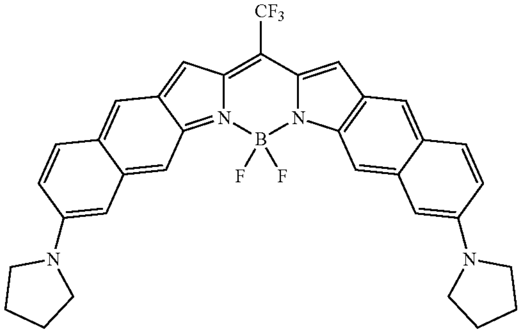

[Compound A-6]

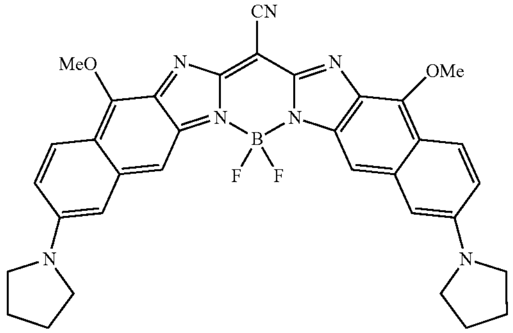

[Compound A-7]

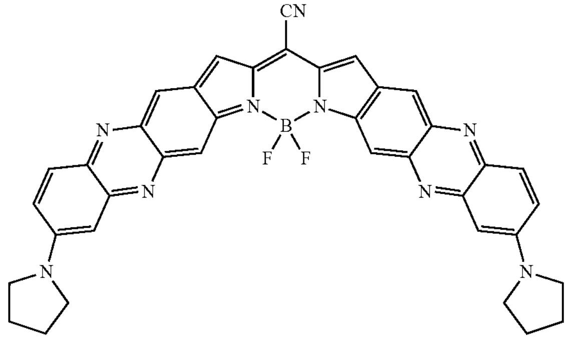

TABLE 1

| | Compound A-5 | Compound A-6 | Compound A-7 |
|---|---|---|---|
| Molecular Weight of the Compounds (g/mol) | 598 | 617 | 659 |
| Calculation Method | Peak absorption wavelength ($\lambda_{max}$) at the longest absorption wavelength region (nm) | | |
| b3lyp/6-311g(d.p) | 1059 | 1,279 | 1,312 |
| wb97xd/6-311g(d.p) | 884 | 1,151 | 1,030 |
| m062x/6-311g(d.p) | 908 | 1,139 | 1,072 |
| m11/6-311g(d.p) | 859 | 1,114 | 988 |
| lc-wpbe/6-311g(d.p) | 825 | 1,076 | 944 |
| Permanent Dipole Moment | 7,403 | 9,645 | 11,005 |
| Structure | semi-flat | semi-flat | semi-flat |

Referring to Table 1, the compounds according to some example embodiments have semi-flat structures and small molecular weights of less than 700 g/mol, and absorb light in long wavelength regions.

Example: Production of Photoelectric Device

A 150 nm-thick anode is formed by sputtering ITO on a glass substrate. Subsequently, each compound represented by Chemical Formula A-1, A-2, A-3, or A-4 according to Synthesis Examples 1 to 4, respectively, is co-deposited with C60 in a 1:1 volume ratio, to form a 150 nm-thick active layer (photoelectric conversion layer). Then, C60 is deposited on the active layer to form a 30 nm-thick auxiliary layer. Then, ITO is sputtered on the auxiliary layer to form a 7 nm-thick cathode. Aluminum oxide ($Al_2O_3$) is deposited on the cathode to form a 50 nm-thick anti-reflection layer and encapsulated with a glass plate to produce the photoelectric devices according to Examples 1 to 4.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A compound represented by Chemical Formula 1:

[Chemical Formula 1]

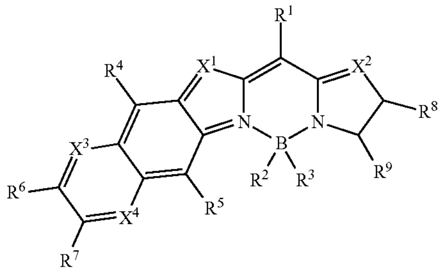

wherein, in Chemical Formula 1, $R^1$ is a substituted or unsubstituted C1 to C30 alkyl group, a substituted or unsubstituted C1 to C30 alkoxy group, a halogen, a cyano group, a nitro group, or any combination thereof, $R^2$ and $R^3$ are independently a halogen, $R^4$ to $R^9$ are independently hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C3 to C30 cycloalkenyl group, a substituted or unsubstituted C2 to C30 heteroalkenyl group, a substituted or unsubstituted C2 to C30 heterocycloalkenyl group, a substituted or unsubstituted C2 to C30 alkynyl group, a substituted or unsubstituted C3 to C30 cycloalkynyl group, a substituted or unsubstituted C2 to C30 heteroalkynyl group, a substituted or unsubstituted C2 to C30 heterocycloalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof, $X^1$ to $X^4$ are independently N or $CR^a$, wherein $R^a$ is hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 heteroalkenyl group, a substituted or unsubstituted C2 to C30 alkynyl group, a substituted or unsubstituted C2 to C30 heteroalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof.

2. The compound of claim 1, wherein in Chemical Formula 1, $R^1$ is a substituted or unsubstituted C1 to C10 alkyl group, a substituted or unsubstituted C1 to C10 alkoxy group, a halogen, cyano group, nitro group, or any combination thereof, and $R^2$ and $R^3$ are independently fluorine, chlorine, bromine, or iodine.

3. The compound of claim 1, wherein in Chemical Formula 1, at least one pair of a pair of $R^6$ and $R^7$ or a pair of $R^8$ and $R^9$ are linked to each other to form at least one substituted or unsubstituted fused ring, and the at least one substituted or unsubstituted fused ring comprises a substituted or unsubstituted C3 to C30 cycloaliphatic group, a substituted or unsubstituted C3 to C30 hetero cycloaliphatic group, a substituted or unsubstituted C6 to C30 aryl group, a substituted or unsubstituted C3 to C30 heteroaryl group, or any combination thereof.

4. The compound of claim 1, wherein in Chemical Formula 1, $X^1$ and $X^2$ are independently $CR^a$, wherein R a is hydrogen, deuterium, a halogen, a substituted or unsubstituted C1 to C10 alkyl group, a substituted or unsubstituted C1 to C5 alkoxy group, or any combination thereof, $X^3$ and $X^4$ are independently N, and $R^4$ to $R^9$ are independently hydrogen, deuterium, a substituted or unsubstituted C1 to C10 alkyl group, a substituted or unsubstituted C3 to C8 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C20 aryl group, or a substituted or unsubstituted C5 to C20 heteroaryl group, a substituted or unsubstituted C1 to C10 alkoxy group, a substituted or unsubstituted C6 to C10 aryloxy group, or any combination thereof.

5. The compound of claim 1, wherein in Chemical Formula 1, $R^1$ is a halogen-substituted C1 to C4 alkyl group, or a cyano group, $R^4$ to $R^9$ are independently hydrogen, deuterium, a halogen, a substituted or unsubstituted C1 to C10 alkyl group, a substituted or unsubstituted C3 to C6 cycloalkyl group, a substituted or unsubstituted C2 to C5 heterocycloalkyl group, a substituted or unsubstituted C2 to C10 alkenyl group, a substituted or unsubstituted C2 to C5 heterocycloalkenyl group, a substituted or unsubstituted C6 to C10 aryl group, a substituted or unsubstituted C1 to C5 alkoxy group, or any combination thereof, and $X^1$ to $X^4$ are independently N or —CH.

6. The compound of claim 1, wherein the compound represented by Chemical Formula 1 comprises a compound represented by Chemical Formula 2:

[Chemical Formula 2]

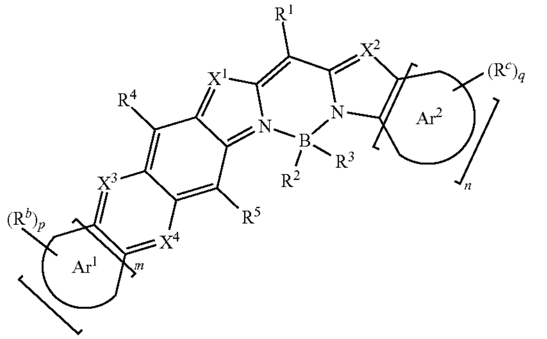

wherein, in Chemical Formula 2, $R^1$ to $R^5$, and $X^1$ to $X^4$ are independently the same as $R^1$ to $R^5$, and $X^1$ to $X^4$ of Chemical Formula 1, $R^b$ and $R^c$ are independently a halogen atom (F, Br, CI, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, or any combination thereof, $Ar^1$ and $Ar^2$ are independently a substituted or unsubstituted C3 to C30 cycloaliphatic group, a substituted or unsubstituted C3 to C30 hetero cycloaliphatic group, a substituted or unsubstituted C6 to C30 aryl group, a substituted or unsubstituted C3 to C30 heteroaryl group, or any combination thereof, m and n are independently an integer ranging from 0 to 7, provided $0 \leq m+n \leq 7$, wherein if m and n are independently an integer greater than or equal to 2, then two or more $Ar^1$ of Chemical Formula 2 are the same as or different from each other, and two or more $Ar^2$ of Chemical Formula 2 are the same as or different from each other, and p and q are independently an integer greater than or equal to 0, provided that p and q are not greater than a valence of $Ar^1$ and $Ar^2$, respectively.

7. The compound of claim 6, wherein in Chemical Formula 2, m and n are independently an integer ranging from 0 to 3.

8. The compound of claim 6, wherein in Chemical Formula 2, m is an integer ranging from 0 to 2, and n is an integer ranging from 1 to 3.

9. The compound of claim 1, wherein the compound represented by Chemical Formula 1 comprises a compound represented by Chemical Formula 3:

[Chemical Formula 3]

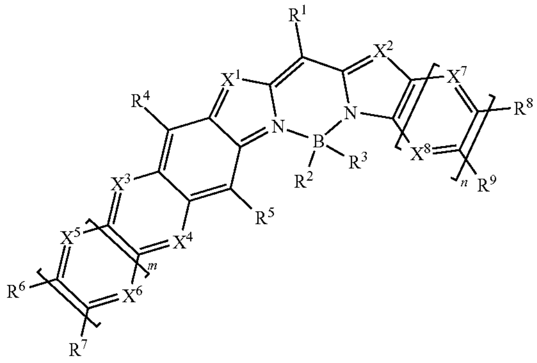

wherein, in Chemical Formula 3, $R^1$ to $R^9$, and $X^1$ to $X^4$ are independently the same as $R^1$ to $R^9$, and $X^1$ to $X^4$ of Chemical Formula 1, $X^5$ to $X^8$ are independently N or $CR^a$, wherein R a is hydrogen, deuterium, a halogen, a substituted or unsubstituted C1 to C30 alkyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C2 to C30 alkenyl group, a substituted or unsubstituted C2 to C30 heteroalkenyl group, a substituted or unsubstituted C2 to C30 alkynyl group, a substituted or unsubstituted C2 to C30 heteroalkynyl group, a substituted or unsubstituted C6 to C30 aryl group, or a substituted or unsubstituted C2 to C30 heteroaryl group, a substituted or unsubstituted C1 to C30 alkoxy group, a substituted or unsubstituted C6 to C30 aryloxy group, or any combination thereof, m and n are independently an integer ranging from 0 to 7, provided $0 \leq m+n \leq 7$, wherein if m and n are independently an integer greater than or equal to 2, then each $X^5$ to $X^8$ included in each repeating structure of Chemical Formula 3 is the same as or different from each $X^5$ to $X^8$ included in other repeating structures of Chemical Formula 3.

10. The compound of claim 9, wherein in Chemical Formula 3, m and n are independently an integer ranging from 0 to 3.

11. The compound of claim 1, wherein the compound represented by Chemical Formula 1 comprises any one of:

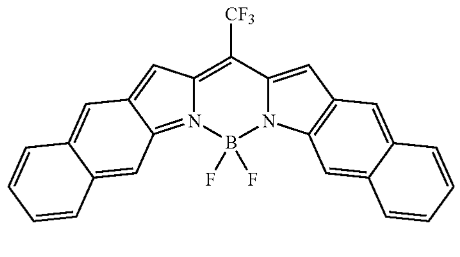

-continued
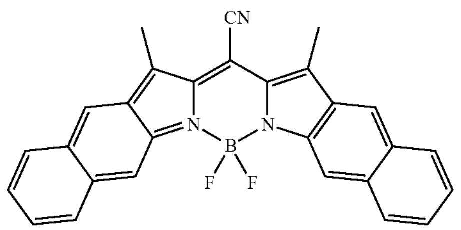
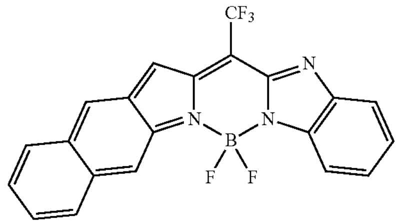
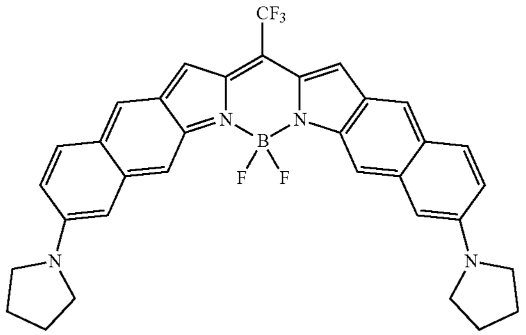
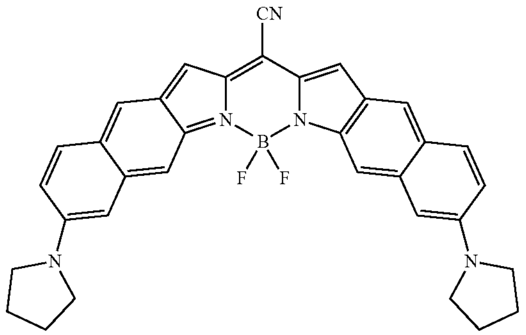
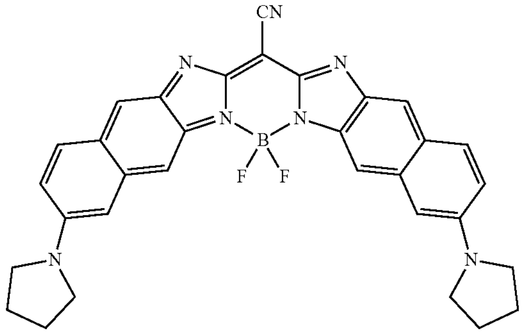
-continued
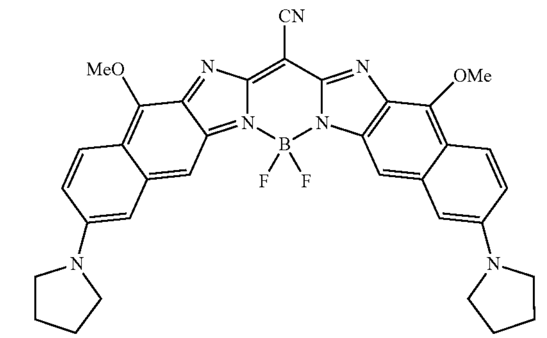
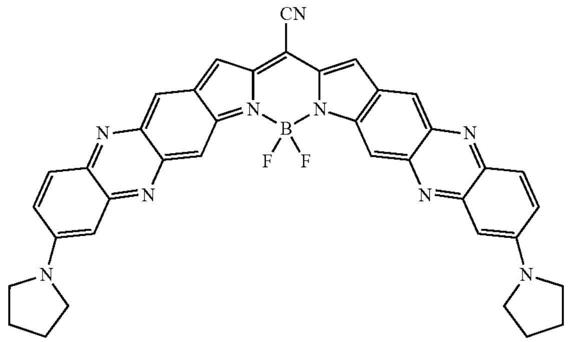
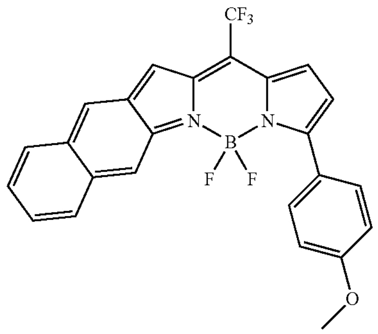
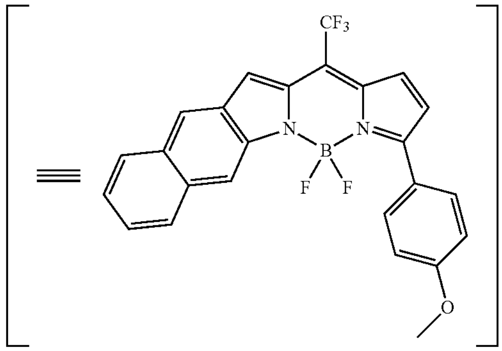

-continued

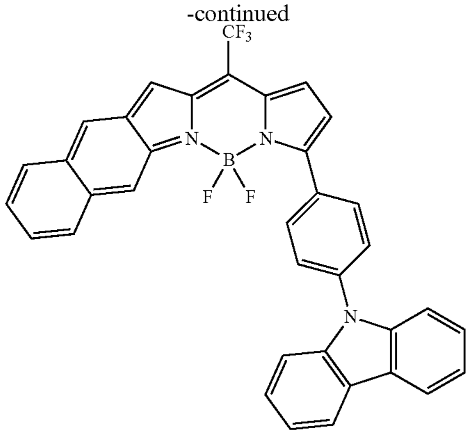

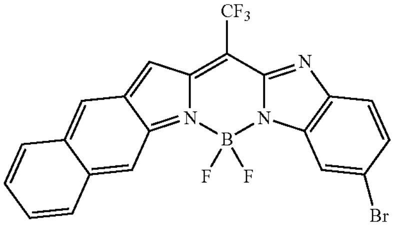

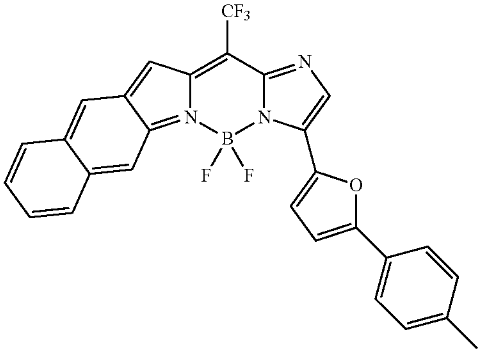

.

12. The compound of claim 1, wherein the compound represented by Chemical Formula 1 has a molecular weight of about 250 grams per mole (g/mol) to about 750 g/mol.

13. The compound of claim 1, wherein a peak absorption wavelength of the compound represented by Chemical Formula 1 is in a wavelength region of about 750 nm to about 3000 nm.

14. A near-infrared absorbing and/or blocking film comprising the compound of claim 1.

15. A photoelectric device comprising:

a first electrode and a second electrode facing each other, and an active layer between the first electrode and the second electrode, wherein the active layer comprises the compound of claim 1.

16. The photoelectric device of claim 15, wherein a peak absorption wavelength of the active layer is in a wavelength region of about 750 nm to about 3000 nm.

17. A photoelectric device comprising:

a first electrode and a second electrode facing each other, an active layer between the first electrode and the second electrode, and a charge auxiliary layer between the active layer and the first electrode, or between the active layer and the second electrode, wherein the charge auxiliary layer comprises the compound of claim 1.

18. An organic sensor comprising the photoelectric device of claim 15.

19. An electronic device comprising the photoelectric device of claim 15.

20. An electronic device comprising the organic sensor of claim 18.

* * * * *